United States Patent
Yang et al.

(10) Patent No.: US 10,094,888 B2
(45) Date of Patent: Oct. 9, 2018

(54) LOW-POWER MAGNETOMETER ASSEMBLIES WITH HIGH OFFSET STABILITY

(71) Applicant: APPLE INC., Cupertino, CA (US)

(72) Inventors: Henry H. Yang, Los Gatos, CA (US); Jian Guo, Milpitas, CA (US)

(73) Assignee: APPLE INC., Cupertino, CA (US)

( * ) Notice: Subject to any disclaimer, the term of this patent is extended or adjusted under 35 U.S.C. 154(b) by 264 days.

(21) Appl. No.: 14/947,968

(22) Filed: Nov. 20, 2015

(65) Prior Publication Data

US 2016/0146903 A1 May 26, 2016

Related U.S. Application Data

(60) Provisional application No. 62/082,433, filed on Nov. 20, 2014.

(51) Int. Cl.
| | |
|---|---|
| *G01R 33/00* | (2006.01) |
| *G01R 33/022* | (2006.01) |
| *G01R 33/028* | (2006.01) |

(52) U.S. Cl.
CPC ....... *G01R 33/0035* (2013.01); *G01R 33/022* (2013.01); *G01R 33/028* (2013.01)

(58) Field of Classification Search
CPC .................................................. G01R 33/0035
See application file for complete search history.

(56) References Cited

U.S. PATENT DOCUMENTS 8,664,941 B2 * 3/2014 Sebastiano ......... G01R 33/0017
324/174

FOREIGN PATENT DOCUMENTS

| CN | 102388316 B | 3/2012 |
|---|---|---|
| CN | 102411402 | 4/2012 |
| CN | 102954808 B | 3/2013 |
| CN | 205301552 | 6/2016 |
| WO | 2010/052664 | 5/2010 |

OTHER PUBLICATIONS

"Hall Effect Sensing and Application." Honeywell, Micro Switch Sensing and Control, 126 pages, http://sensing.honeywell.com/index.php?ci_id=47847, retrieved on Oct. 23, 2014.

* cited by examiner

*Primary Examiner* — Manuel A Rivera Vargas
(74) *Attorney, Agent, or Firm* — Van Court & Aldridge LLP

(57) ABSTRACT

Systems, methods, and computer-readable media for calibrating the offset of a magnetometer assembly with reduced power are provided. In one embodiment, a method for operating an assembly may include determining a difference between a current signal measurement output component of a first magnetometer sensor and a previous signal measurement output component of the first magnetometer sensor, comparing the determined difference with a current threshold value, and generating an assembly output based on the comparing, where, when the determined difference is greater than the current threshold value, the generating may include providing a first assembly output using a current offset output component of a second magnetometer sensor, and, when the determined difference is less than the current threshold value, the generating may include providing a second assembly output using a previous offset output component of the second magnetometer sensor.

30 Claims, 6 Drawing Sheets

LOW-POWER MAGNETOMETER ASSEMBLIES WITH HIGH OFFSET STABILITY

CROSS-REFERENCE TO RELATED APPLICATION(S)

This application claims the benefit of prior filed U.S. Provisional Patent Application No. 62/082,433, filed Nov. 20, 2014, which is hereby incorporated by reference herein in its entirety.

TECHNICAL FIELD

This disclosure relates to magnetometer assemblies and, more particularly, to hybrid magnetometer assemblies with low-power and high offset stability for electronic devices.

BACKGROUND OF THE DISCLOSURE

An electronic device (e.g., a laptop computer, a cellular telephone, etc.) may be provided with a magnetometer assembly for measuring a magnetic property of the device's environment. However, heretofore, such magnetometer assemblies have required large amounts of power and/or lacked robust offset stability.

SUMMARY OF THE DISCLOSURE

This document describes systems, methods, and computer-readable media for calibrating the offset of a magnetometer assembly with reduced power.

For example, an electronic device may include a sensor assembly including a first magnetometer sensor and a second magnetometer sensor, and a sensor management system operative to determine a difference between a current output of the first magnetometer sensor and a previous output of the first magnetometer sensor, determine a current threshold value, compare the determined difference with the determined current threshold value, and generate a system output based on the comparison. When the determined difference is greater than the determined current threshold value based on the comparison, the sensor management system is operative to generate the system output using an offset output component of a current output of the second magnetometer sensor, and, when the determined difference is not greater than the determined current threshold value based on the comparison, the sensor management system is operative to generate the system output using an offset output component of a previous output of the second magnetometer sensor.

As another example, a method for operating an assembly that includes a first magnetometer sensor and a second magnetometer sensor may include determining a difference between a current signal measurement output component of a current output of the first magnetometer sensor and a previous signal measurement output component of a previous output of the first magnetometer sensor, comparing the determined difference with a current threshold value, and generating an assembly output based on the comparing. When the determined difference is greater than the current threshold value based on the comparing, the generating includes providing a first assembly output using a current offset output component of a current output of the second magnetometer sensor, and, when the determined difference is less than the current threshold value based on the comparing, the generating includes providing a second assembly output using a previous offset output component of a previous output of the second magnetometer sensor.

As yet another example, a method for operating an assembly that includes a first magnetometer sensor and a second magnetometer sensor may include determining an output difference between a new output of the first magnetometer sensor and a previous output of the first magnetometer sensor, accessing a current threshold, comparing the determined output difference with the accessed current threshold, and selectively updating the value of a stored offset based on the comparing, wherein the selectively updating includes not changing the value of the stored offset when the determined output difference is not greater than the accessed current threshold based on the comparing, and changing the value of the stored offset when the determined output difference is greater than the accessed current threshold based on the comparing, wherein the changing includes determining a sensor difference between the new output of the first magnetometer sensor and a new output of the second magnetometer sensor, and storing the determined sensor difference as the value of the stored offset. The method may also include, after the selectively updating, generating an assembly output using the new output of the first magnetometer sensor and the value of the stored offset.

As yet another example, a hybrid magnetometer sensor assembly may include a first magnetometer sensor and a second magnetometer sensor, wherein the assembly is operative to re-center a transfer function of the first magnetometer sensor using an offset output component of an output of the second magnetometer sensor, and generate an assembly output using the re-centered transfer function and a signal measurement output component of an output of the first magnetometer sensor.

As yet another example, a method for operating an assembly that includes a first magnetometer sensor and a second magnetometer sensor may include re-centering a transfer function of the first magnetometer sensor using an offset output component of an output of the second magnetometer sensor, and generating an assembly output using the re-centered transfer function and a signal measurement output component of an output of the first magnetometer sensor.

As yet another example, a non-transitory computer-readable medium for controlling an electronic device may include computer-readable instructions recorded thereon for re-centering a transfer function of a first magnetometer sensor of the electronic device using an offset output component of an output of a second magnetometer sensor of the electronic device, and generating an output of the electronic device using the re-centered transfer function and a signal measurement output component of an output of the first magnetometer sensor.

This Summary is provided merely to summarize some example embodiments, so as to provide a basic understanding of some aspects of the subject matter described in this document. Accordingly, it will be appreciated that the features described in this Summary are merely examples and should not be construed to narrow the scope or spirit of the subject matter described herein in any way. Unless otherwise stated, features described in the context of one example may be combined or used with features described in the context of one or more other examples. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters may refer to like parts throughout, and in which.

DETAILED DESCRIPTION OF THE DISCLOSURE

Systems, methods, and computer-readable media may be provided for calibrating the offset of a magnetometer assembly of an electronic device with low power consumption. A magnetometer assembly may include a first magnetometer sensor and a second magnetometer sensor, where the first sensor may be configured to have one or more higher-performance characteristics, such as a higher operating speed and/or lower power consumption and/or lower noise performance, as compared to the second sensor, which may be configured to have higher offset stability than the first sensor. The magnetometer assembly may be configured to leverage the higher offset stability of the second sensor in certain conditions as may be warranted in combination with one or more of the higher performance characteristics of the first sensor to provide a hybrid magnetometer architecture that may be both efficient and accurate. For example, such a hybrid magnetometer architecture may be configured to exploit the high-stability of the second sensor (e.g., a Hall sensor) to re-center or otherwise manipulate a signal transfer function of the first sensor (e.g., a giant magnetoresistive ("GMR") sensor), which may thereby lead to a high performance magnetic sensing system. A fixed or dynamic threshold may be utilized for determining when the higher offset stability of the second sensor is relied upon by the magnetometer assembly. Such a threshold may be varied based on the environment in which the magnetometer assembly is currently being used, which may increase the efficiency of the system by only using the second sensor when necessary.

Figure 1:
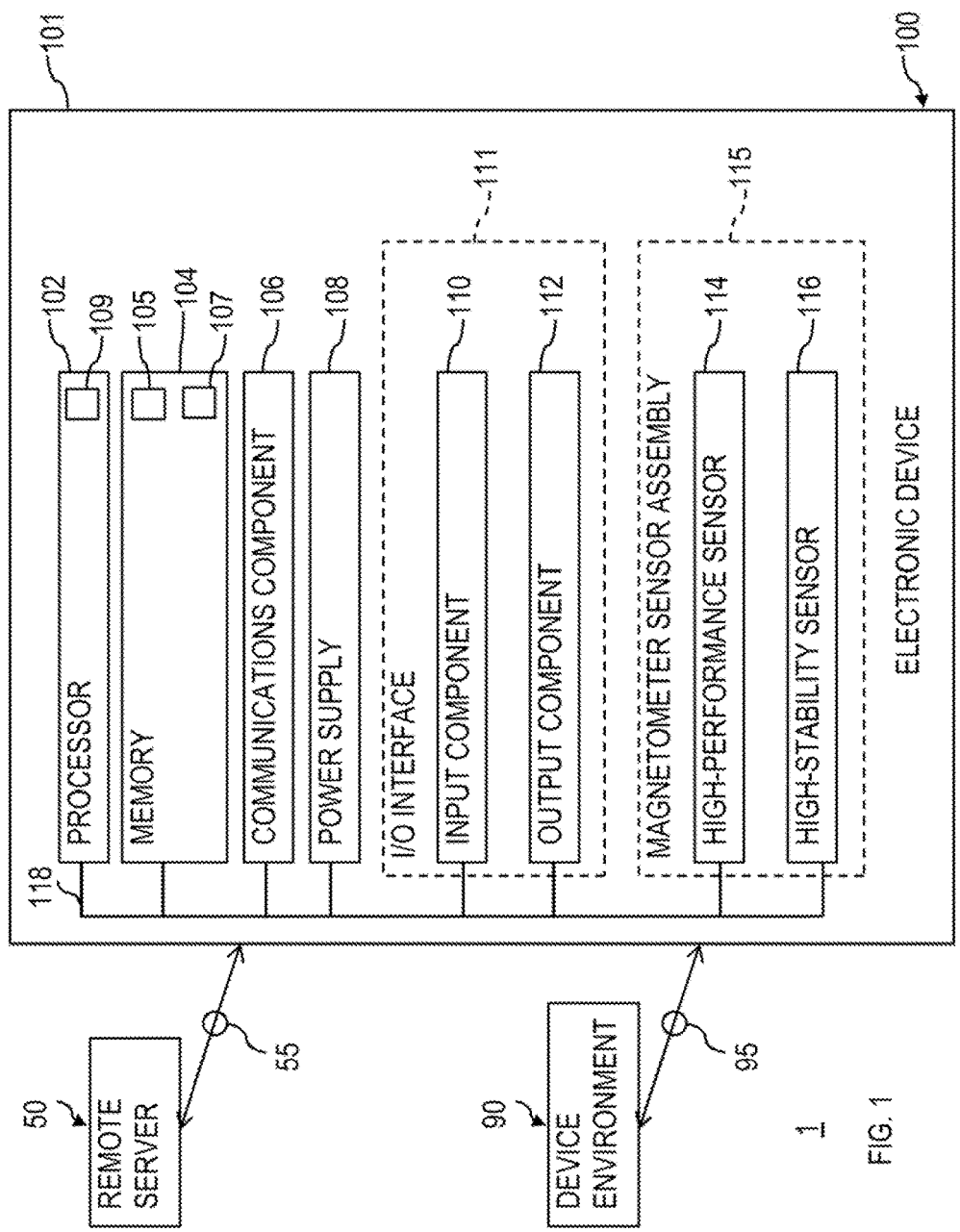
FIG. 1 is a schematic view of an illustrative system including an electronic device with a magnetometer sensor assembly.

Description of FIG. 1

FIG. 1 is a schematic view of a system 1 with an illustrative electronic device 100 that may include a magnetometer sensor assembly, which may operate with low-power and high offset stability for measuring a magnetic property of the device's environment. Electronic device 100 can include, but is not limited to, a music player (e.g., an iPod™ available by Apple Inc. of Cupertino, Calif.), video player, still image player, game player, other media player, music recorder, movie or video camera or recorder, still camera, other media recorder, radio, medical equipment, domestic appliance, transportation vehicle instrument, musical instrument, calculator, cellular telephone (e.g., an iPhone™ available by Apple Inc.), other wireless communication device, personal digital assistant, remote control, pager, computer (e.g., a desktop, laptop, tablet (e.g., an iPad™ available by Apple Inc.), server, etc.), monitor, television, stereo equipment, set up box, set-top box, boom box, modem, router, printer, or any combination thereof. In some embodiments, electronic device 100 may perform a single function (e.g., a device dedicated to measuring a magnetic property of the device's environment) and, in other embodiments, electronic device 100 may perform multiple functions (e.g., a device that measures a magnetic property of the device's environment, plays music, and receives and transmits telephone calls).

Electronic device 100 may be any portable, mobile, hand-held, or miniature electronic device that may be configured to measure a magnetic property of the device's environment wherever a user travels. Some miniature electronic devices may have a form factor that is smaller than that of hand-held electronic devices, such as an iPod™. Illustrative miniature electronic devices can be integrated into various objects that may include, but are not limited to, watches (e.g., an Apple Watch™ available by Apple Inc.), rings, necklaces, belts, accessories for belts, headsets, accessories for shoes, virtual reality devices, glasses, other wearable electronics, accessories for sporting equipment, accessories for fitness equipment, key chains, or any combination thereof. Alternatively, electronic device 100 may not be portable at all, but may instead be generally stationary.

As shown in FIG. 1, for example, electronic device 100 may include a processor 102, memory 104, communications component 106, power supply 108, input component 110, output component 112, and magnetometer or magnetic sensor assembly 115. Electronic device 100 may also include a bus 118 that may provide one or more wired or wireless communication links or paths for transferring data and/or power to, from, or between various other components of device 100. In some embodiments, one or more components of electronic device 100 may be combined or omitted. Moreover, electronic device 100 may include any other suitable components not combined or included in FIG. 1 and/or several instances of the components shown in FIG. 1. For the sake of simplicity, only one of each of the components is shown in FIG. 1.

Memory 104 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 104 may include cache memory, which may be one or more different types of memory used for temporarily storing data for electronic device applications. Memory 104 may be fixedly embedded within electronic device 100 or may be incorporated onto one or more suitable types of components that may be repeatedly inserted into and removed from electronic device 100 (e.g., a subscriber identity module ("SIM") card or secure digital ("SD") memory card). Memory 104 may store media data (e.g., music and image files), software (e.g., for implementing functions on device 100), firmware, preference information (e.g., media playback preferences), lifestyle information (e.g., food preferences), exercise information (e.g., information obtained by exercise monitoring equipment), transaction information (e.g., credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, pass information (e.g., transportation boarding passes, event tickets, coupons, store cards, financial payment cards, etc.), threshold data (e.g., an updateable value of a threshold source or register 105), offset data (e.g., an updateable offset value of an offset source or register 107), any other suitable data, or any combination thereof.

Communications component 106 may be provided to allow device 100 to communicate with one or more other electronic devices or servers of system 1 (e.g., data source or server 50, as may be described below) using any suitable communications protocol. For example, communications component 106 may support Wi-Fi™ (e.g., an 802.11 protocol), ZigBee™ (e.g., an 802.15.4 protocol), WiDi™, Ethernet, Bluetooth™, Bluetooth™ Low Energy ("BLE"), high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), Stream Control Transmission Protocol ("SCTP"), Dynamic Host Configuration Protocol ("DHCP"), hypertext transfer protocol ("HTTP"), BitTorrent™, file transfer protocol ("FTP"), real-time transport protocol ("RTP"), real-time streaming protocol ("RTSP"), real-time control protocol ("RTCP"), Remote Audio Output Protocol ("RAOP"), Real Data Transport Protocol™ ("RDTP"), User Datagram Protocol ("UDP"), secure shell protocol ("SSH"), wireless distribution system ("WDS") bridging, any communications protocol that may be used by wireless and cellular telephones and personal e-mail devices (e.g., Global System for Mobile Communications ("GSM"), GSM plus Enhanced Data rates for GSM Evolution ("EDGE"), Code Division Multiple Access ("CDMA"), Orthogonal Frequency-Division Multiple Access ("OFDMA"), high speed packet access ("HSPA"), multi-band, etc.), any communications protocol that may be used by a low power Wireless Personal Area Network ("6LoWPAN") module, any other communications protocol, or any combination thereof. Communications component 106 may also include or may be electrically coupled to any suitable transceiver circuitry that can enable device 100 to be communicatively coupled to another device (e.g., a host computer, scanner, accessory device, etc.), such as server 50, and communicate data 55 with that other device wirelessly, or via a wired connection (e.g., using a connector port). Communications component 106 may be configured to determine a geographical position of electronic device 100 and/or any suitable data that may be associated with that position. For example, communications component 106 may utilize a global positioning system ("GPS") or a regional or site-wide positioning system that may use cell tower positioning technology or Wi-Fi™ technology, or any suitable location-based service or real-time locating system, which may leverage a geo-fence for providing any suitable location-based data to device 100. As described below in more detail, system 1 may include any suitable remote entity or data source, such as server 50, that may be configured to communicate any suitable data 55 with electronic device 100 (e.g., via communications component 106) using any suitable communications protocol and/or any suitable communications medium.

Power supply 108 may include any suitable circuitry for receiving and/or generating power, and for providing such power to one or more of the other components of electronic device 100. For example, power supply 108 can be coupled to a power grid (e.g., when device 100 is not acting as a portable device or when a battery of the device is being charged at an electrical outlet with power generated by an electrical power plant). As another example, power supply 108 may be configured to generate power from a natural source (e.g., solar power using solar cells). As another example, power supply 108 can include one or more batteries for providing power (e.g., when device 100 is acting as a portable device). For example, power supply 108 can include one or more of a battery (e.g., a gel, nickel metal hydride, nickel cadmium, nickel hydrogen, lead acid, or lithium-ion battery), an uninterruptible or continuous power supply ("UPS" or "CPS"), and circuitry for processing power received from a power generation source (e.g., power generated by an electrical power plant and delivered to the user via an electrical socket or otherwise). The power can be provided by power supply 108 as alternating current or direct current, and may be processed to transform power or limit received power to particular characteristics. For example, the power can be transformed to or from direct current, and constrained to one or more values of average power, effective power, peak power, energy per pulse, voltage, current (e.g., measured in amperes), or any other characteristic of received power. Power supply 108 can be operative to request or provide particular amounts of power at different times, for example, based on the needs or requirements of electronic device 100 or periphery devices that may be coupled to electronic device 100 (e.g., to request more power when charging a battery than when the battery is already charged).

One or more input components 110 may be provided to permit a user or device environment to interact or interface with device 100. For example, input component 110 can take a variety of forms, including, but not limited to, a touch pad, dial, click wheel, scroll wheel, touch screen, one or more buttons (e.g., a keyboard), mouse, joy stick, track ball, microphone, camera, scanner (e.g., a barcode scanner or any other suitable scanner that may obtain product identifying information from a code, such as a linear barcode, a matrix barcode (e.g., a quick response ("QR") code), or the like), proximity sensor, light detector, biometric sensor (e.g., a fingerprint reader or other feature recognition sensor, which may operate in conjunction with a feature-processing application that may be accessible to electronic device 100 for authenticating a user), line-in connector for data and/or power, and combinations thereof. Each input component 110 can be configured to provide one or more dedicated control functions for making selections or issuing commands associated with operating device 100.

Electronic device 100 may also include one or more output components 112 that may present information (e.g., graphical, audible, and/or tactile information) to a user of device 100. For example, output component 112 of electronic device 100 may take various forms, including, but not limited to, audio speakers, headphones, line-out connectors for data and/or power, visual displays (e.g., for transmitting data via visible light and/or via invisible light), infrared ports, flashes (e.g., light sources for providing artificial light for illuminating an environment of the device), tactile/haptic outputs (e.g., rumblers, vibrators, etc.), and combinations thereof. As a specific example, electronic device 100 may include a display assembly output component as output component 112, where such a display assembly output component may include any suitable type of display or interface for presenting visual data to a user with visible light. A display assembly output component may include a display embedded in device 100 or coupled to device 100 (e.g., a removable display). A display assembly output component may include, for example, a liquid crystal display ("LCD"), a light emitting diode ("LED") display, a plasma display, an organic light-emitting diode ("OLED") display, a surface-conduction electron-emitter display ("SED"), a carbon nanotube display, a nanocrystal display, any other suitable type of display, or combination thereof. Alternatively, a display assembly output component can include a movable display or a projecting system for providing a display of content on a surface remote from electronic device 100, such as, for example, a video projector, a head-up display, or a three-dimensional (e.g., holographic) display. As another example, a display assembly output component may include a digital or mechanical viewfinder, such as a viewfinder of the type found in compact digital cameras, reflex cameras, or any other suitable still or video camera. A display assembly output component may include display driver circuitry, circuitry for driving display drivers, or both, and such a display assembly output component can be operative to display content (e.g., media playback information, application screens for applications implemented on electronic device 100, information regarding ongoing communications operations, information regarding incoming communications requests, device operation screens, etc.) that may be under the direction of processor 102.

It should be noted that one or more input components and one or more output components may sometimes be referred to collectively herein as an input/output ("I/O") component or I/O interface (e.g., input component 110 and output component 112 as I/O component or I/O interface 111). For example, input component 110 and output component 112 may sometimes be a single I/O interface 111, such as a touch screen, that may receive input information through a user's touch of a display screen and that may also provide visual information to a user via that same display screen.

Magnetometer sensor assembly 115 may include any suitable sensor assembly that may be configured to measure a magnetic property 95 of the environment 90 of electronic device 100 (e.g., to measure the magnetization 95 of a magnetic material 90 proximate device 100, to measure the strength and/or direction of a magnetic field 95 (e.g., along each of one, two, or three axes) at a point in space 90 that may be occupied by device 100, etc.). Sensor assembly 115 may include any suitable sensor or any suitable combination of sensors that may be operative to detect or otherwise measure a magnetic property of the environment of device 100 according to any suitable technique. In some embodiments, sensor assembly 115 may include at least two sensor components, such as a first magnetometer sensor or high-performance sensor 114 and a second magnetometer sensor or high-stability sensor component 116, where the two or more sensor components of sensor assembly 115 may be leveraged together by device 100 to measure one or more particular magnetic properties in a more efficient or otherwise improved manner than may be possible by leveraging only a single one of such sensor components to do such measuring.

For example, in some embodiments, high-performance sensor 114 may have at least one certain characteristic that may be more desirable than at least one certain characteristic of high-stability sensor component 116, while, conversely, high-stability sensor component 116 may have at least one certain other characteristic that may be more desirable than at least one certain other characteristic of high-performance sensor 114. As just one example, high-performance sensor 114 may be configured to operate with a first power consumption and at a first speed for producing an output with a first noise performance and a first offset stability, while high-stability sensor 116 may be configured to operate with a second power consumption and at a second speed for producing an output with a second noise performance and a second offset stability, where at least one of the first power consumption characteristic, the first speed characteristic, and the first noise performance characteristic of high-performance sensor 114 may be better than a respective at least one of the second power consumption characteristic, the second speed characteristic, and the second noise performance characteristic of high-stability sensor 116, yet where the second offset stability of high-stability sensor 116 may be better (e.g., higher) than the first offset stability of high-performance sensor 114.

Following such an embodiment, high-performance sensor 114 may be configured to operate with a power consumption that may be any suitable magnitude, such as a magnitude in a range between 100 microwatts and 500 microwatts, or, more particularly, a magnitude about or equal to 300 microwatts, while high-stability sensor 116 may be configured to operate with a higher power consumption that may be any suitable magnitude, such as a magnitude in a range between 1 milliwatt and 20 milliwatts, or, more particularly, a magnitude about or equal to 15 milliwatts or 4 milliwatts. Therefore, high-performance sensor 114 may be configured to operate with about 10-50 times less power consumption than high-stability sensor 116. Although, it is to be understood that high-performance sensor 114 may be configured to operate with any suitable power consumption that may be less than any suitable power consumption at which high-stability sensor 116 may be configured to operate by any suitable magnitude, such that high-performance sensor 114 may be configured to operate with a more preferable or better power consumption than high-stability sensor 116.

Additionally or alternatively, following such an embodiment, high-performance sensor 114 may be configured to operate at a speed that may be any suitable magnitude, such as a magnitude in a range between 10 hertz and 200 hertz, or, more particularly, a magnitude about or equal to 100 hertz, while high-stability sensor 116 may be configured to operate at a lower speed that may be any suitable magnitude, such as a magnitude in a range between 10 hertz and 100 hertz, or, more particularly, a magnitude about or equal to 100 hertz. Therefore, high-performance sensor 114 may be configured to operate at about 2 times the speed of high-stability sensor 116, although sensor 114 and sensor 116 may be configured to operate at the same speed (e.g., 100 hertz), yet sensor 116 may only be active when a calibration is requested (e.g., as described below, which may reduce power consumption). Although, it is to be understood that high-performance sensor 114 may be configured to operate at any suitable speed that may be greater than any suitable speed at which high-stability sensor 116 may be configured to operate by any suitable magnitude, such that high-performance sensor 114 may be configured to operate with a more preferable or better speed or response time than high-stability sensor 116.

Additionally or alternatively, following such an embodiment, high-performance sensor 114 may be configured to produce an output with a noise performance that may be any suitable magnitude, such as a magnitude in a range between 0.1 microTesla and 0.3 microTesla, or, more particularly, a magnitude about or equal to 0.2 microTesla, while high-stability sensor 116 may be configured to produce an output with a higher noise performance that may be any suitable magnitude, such as a magnitude in a range between 1.1 microTesla and 1.3 microTesla, or, more particularly, a magnitude about or equal to 1.2 microTesla. Therefore, high-performance sensor 114 may be configured to produce an output with about 6 times less noise than high-stability sensor 116. Although, it is to be understood that high-performance sensor 114 may be configured to produce an output with any suitable noise performance that may be less than any suitable noise performance of an output which high-stability sensor 116 may be configured to produce by any suitable magnitude, such that high-performance sensor 114 may be configured to operate with a more preferable or better noise performance than high-stability sensor 116.

Additionally or alternatively, following such an embodiment, high-performance sensor 114 may be configured to produce an output with an offset stability that may be any suitable magnitude, such as a magnitude in a range between 10 microTesla and 20 microTesla, or, more particularly, a magnitude about or equal to 15 microTesla, while high-stability sensor 116 may be configured to produce an output with a higher offset stability that may be any suitable magnitude, such as a magnitude in a range between 500 microTesla and 2,000 microTesla, or, more particularly, a magnitude about or equal to 1,000 microTesla. Therefore, high-stability sensor 116 may be configured to produce an output with about 50-100 times higher offset stability than high-performance sensor 114. Although, it is to be understood that high-stability sensor 116 may be configured to produce an output with any suitable offset stability that may be higher than any suitable offset stability of an output which high-performance sensor 114 may be configured to produce by any suitable magnitude, such that high-stability sensor 116 may be configured to operate with a more preferable or better offset stability than high-performance sensor 114. Although sensor 116 may have higher stability than sensor 114, sensor 114 may still be considered stable, at least as compared to other possible sensors, in some embodiments. However, the offset of sensor 114 may be more prone to shift when exposed to a strong external magnetic field, as compared to that of sensor 116.

High-performance sensor 114 may be any suitable sensor component or combination of sensor components that may be configured to perform with at least one certain characteristic (e.g., power consumption, speed, response time, sensitivity, noise, etc.) that may be more desirable than at least one such certain performance characteristic of high-stability sensor component 116, despite that high-performance sensor 114 may be configured to perform with a lower offset stability than high-stability sensor component 116. For example, high-performance sensor 114 may be considered a high performing sensor with low stability as compared to high-stability sensor component 116 that may be considered a low performing sensor with high stability. High-performance sensor 114 may be any suitable magnetic sensor, including, but not limited to, any suitable sensor that may utilize magnetoresistance (e.g., the property of a material that may change a value of its electrical resistance when an external magnetic field is applied to the material), such as a magnetoresistive ("MR") sensor, a giant magnetoresistive ("GMR") sensor, a tunnel magnetoresistive ("TMR") sensor, an anisotropic magnetoresistive ("AMR") sensor, and the like, any suitable sensor that may utilize a superconducting quantum interference device ("SQUID"), any suitable fluxgate magnetometer, any suitable sensor that may utilize a Lorentz force (e.g., using Lorentz force velocimetry ("LFV"), etc.), any other suitable magnetometer, such as a Hall effect magnetometer or Hall effect sensor that may utilize the Hall effect (e.g., the production of a voltage difference across an electrical conductor that may change when a magnetic field perpendicular to a current in the conductor changes), any combinations thereof, and the like. High-stability sensor component 116 may be any suitable magnetic sensor, such as any of the sensors just described, but may be configured to have a higher offset stability than high-performance sensor component 114 and a weaker performance characteristic (e.g., speed, response time, sensitivity, power consumption, and/or noise) than high-performance sensor component 114. As just one particular example, high-performance sensor 114 may be a 16-bit 3-axis GMR sensor that may be configured to operate with a first power consumption of about 300 microwatts at a speed of about 100 hertz for producing an output with a noise performance of about 0.2 microTesla and an offset stability of about 1000 microTesla, while high-stability sensor component 116 may be a 16-bit 3-axis Hall-Effect sensor that may be configured to operate with a power consumption of about 4 milliwatts at a speed of about 100 hertz for producing an output with a noise performance of about 1.2 microTesla and an offset stability of about 15 microTesla. Although it is to be understood that high-performance sensor 114 may be any suitable magnetic sensor that may have a lower offset stability and yet at least one performance characteristic (e.g., speed, power consumption, noise, etc.) that may be better than high-stability sensor 116. As described below (e.g., with respect to FIGS. 2-6), electronic device 100 may be configured to leverage high-performance sensor 114 together with high-stability sensor 116 to provide a hybrid magnetometer assembly with low-power and high offset stability and/or to calibrate the offset of a magnetometer assembly with reduced power.

Processor 102 of electronic device 100 may include any processing circuitry that may be operative to control the operations and performance of one or more components of electronic device 100. For example, processor 102 may receive input signals from input component 110 and/or drive output signals through output component 112. As shown in FIG. 1, processor 102 may be used to run one or more applications, such as an application 109. Application 109 may include, but is not limited to, one or more operating system applications, firmware applications, media playback applications, media editing applications, pass applications, calendar applications, state determination applications, biometric feature-processing applications, compass applications, any other suitable magnetic-detection-based applications, or any other suitable applications. For example, processor 102 may load application 109 as a user interface program to determine how instructions or data received via an input component 110 or other component of device 100 may manipulate the one or more ways in which information may be stored and/or provided to the user via an output component 112. As another example, processor 102 may load application 109 as a background application program or a user-detectable application program to determine how instructions or data received via sensor assembly 115 and/or server 50 may manipulate the one or more ways in which information may be stored and/or otherwise used to control at least one function of device 100 (e.g., as a magnetic sensor application). Application 109 may be accessed by processor 102 from any suitable source, such as from memory 104 (e.g., via bus 118) or from another device or server (e.g., server 50 or any other suitable remote source via communications component 106). Processor 102 may include a single processor or multiple processors. For example, processor 102 may include at least one "general purpose" microprocessor, a combination of general and special purpose microprocessors, instruction set processors, graphics processors, video processors, and/or related chips sets, and/or special purpose microprocessors. Processor 102 also may include on board memory for caching purposes.

Electronic device 100 may also be provided with a housing 101 that may at least partially enclose one or more of the components of device 100 for protection from debris and other degrading forces external to device 100. In some embodiments, one or more of the components may be provided within its own housing (e.g., input component 110 may be an independent keyboard or mouse within its own housing that may wirelessly or through a wire communicate with processor 102, which may be provided within its own housing).

Figure 2:
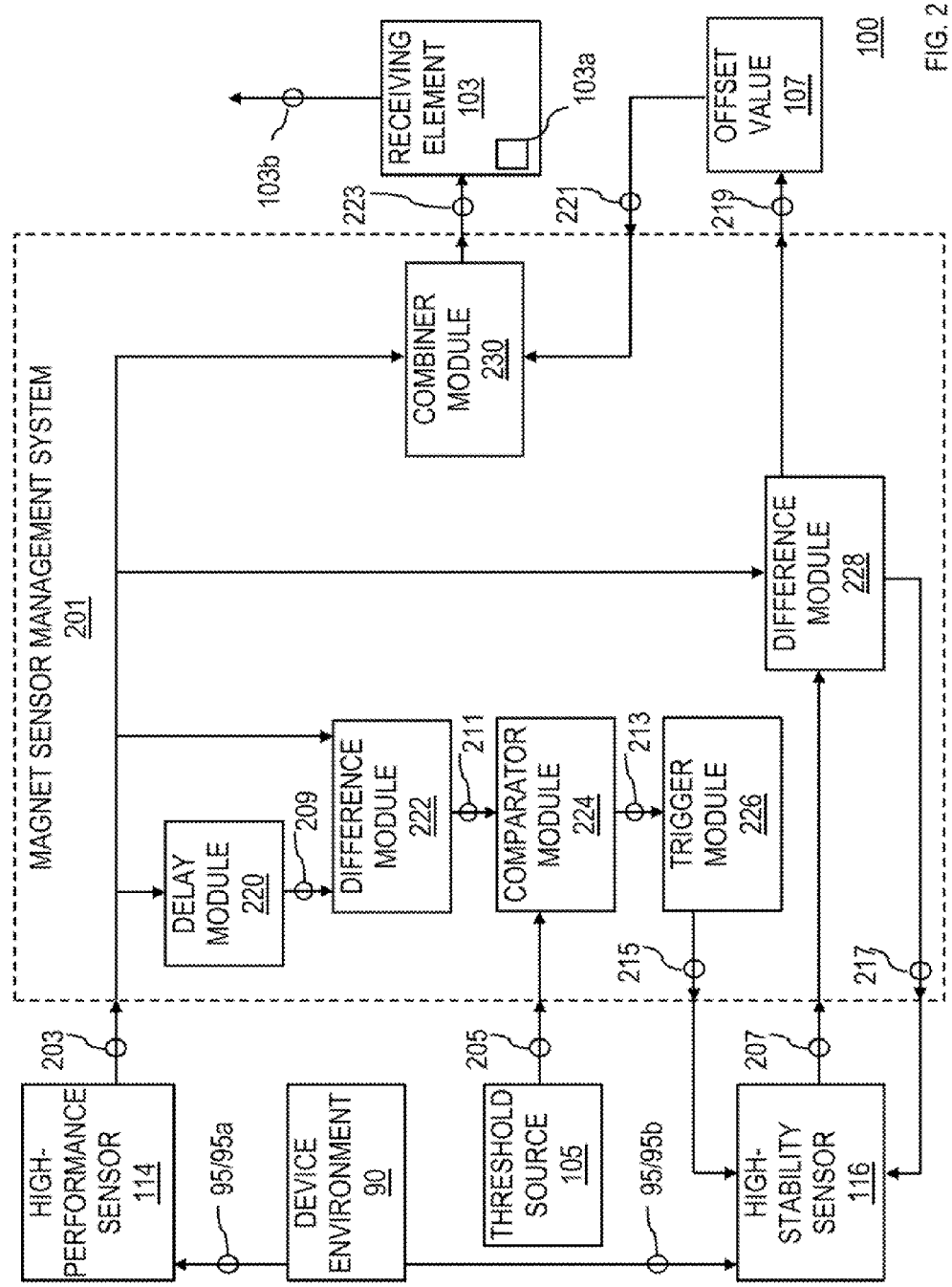
FIG. 2 is a schematic view of an illustrative portion of the electronic device of FIG. 1.

Description of FIG. 2

FIG. 2 shows a schematic view of a magnet sensor management system 201 of electronic device 100 that may be provided to enable a hybrid magnetometer assembly with high performance (e.g., low-power) and high offset stability (e.g., by calibrating the offset of a magnetometer assembly) for measuring a magnetic property of the environment of device 100. System 201 may be configured to receive sensor data from multiple sensors of sensor assembly 115 (e.g., sensors 114 and 116) and to leverage such received sensor data in combination with a value of threshold source 105 for providing system output data to a receiving element (e.g., a magnetic-detection-based application 103), while operating with high offset stability and low power consumption, thereby enabling accurate and efficient measurement of a magnetic property 95 of the environment 90 of device 100. For example, as shown, system 201 may be configured to receive sensor output data 203 from high-performance sensor 114, where sensor output data 203 may be any suitable sensor output data that may be generated and transmitted by high-performance sensor 114 in response to high-performance sensor 114 detecting or otherwise being exposed to magnetic property 95 of environment 90 (e.g., magnetic data 95a of FIG. 2). As also shown, system 201 may be configured to receive threshold output data 205 from a threshold source 105 of device 100 (e.g., memory 104), where threshold output data 205 provided by threshold source 105 may be fixed or varied based on any suitable criteria or controller (e.g., based on application 103 or any other suitable instructions, as may be described below in more detail). Moreover, as also shown, system 201 may be configured to receive sensor output data 207 from high-stability sensor 116, where sensor output data 207 may be any suitable sensor output data that may be generated and transmitted by high-stability sensor 116 in response to high-stability sensor 116 detecting or otherwise being exposed to magnetic property 95 of environment 90 (e.g., magnetic data 95b of FIG. 2).

In some embodiments, at any particular point in time, magnetic data 95a detected by high-performance sensor 114 may be the same as magnetic data 95b detected by high-stability sensor 116, as the magnetic property 95 of environment 90 exposed to each one of high-performance sensor 114 and high-stability sensor 116 at that time may be the same, and as high-performance sensor 114 and high-stability sensor 116 may be positioned physically close enough to one another within sensor assembly 115 of device 100 such that the magnetic property 95 may be detected similarly by high-performance sensor 114 as magnetic data 95a and by high-stability sensor 116 as magnetic data 95b. Alternatively, in other embodiments, at any particular point in time, magnetic data 95a detected by high-performance sensor 114 may be at least partially different than magnetic data 95b detected by high-stability sensor 116, as, despite the fact that the same magnetic property 95 of environment 90 is exposed to each one of high-performance sensor 114 and high-stability sensor 116 at that time, high-performance sensor 114 and high-stability sensor 116 may be positioned physically apart from one another within sensor assembly 115 of device 100 by a particular distance or at different orientations such that the magnetic property 95 may be detected differently by high-performance sensor 114 as magnetic data 95a and by high-stability sensor 116 as magnetic data 95b. That is, while environment 90 may provide a single magnetic property 95 at a given moment in time (e.g., as the magnetization of a magnetic material, as the strength and/or direction of a magnetic field at a point in space), that magnetic property 95 may be detected as at least slightly different forms of magnetic data by high-performance sensor 114 and by high-stability sensor 116 (e.g., as magnetic data 95a and as magnetic data 95b, respectively), for example, due to the different positions of high-performance sensor 114 and high-stability sensor 116 with respect to a particular environment entity 90. Moreover, despite the same magnetic property 95 of environment 90 being detectable by high-performance sensor 114 and high-stability sensor 116, the resulting sensor output data 203 and the resulting sensor output data 207 that may be generated and transmitted by high-performance sensor 114 and high-stability sensor 116, respectively, may differ from one another in one or more various ways (e.g., due to the different possible configurations and properties of high-performance sensor 114 and high-stability sensor 116, as described above (e.g., with respect to noise, offset stability, etc.)).

System 201 may be configured to determine whether to update a calibrated offset value (e.g., value 107) for use with sensor assembly 115, where such a calibrated offset value may be based on an offset component of sensor output data 207 of high-stability sensor 116, and where such a calibrated offset value may be combined with a magnetic property signal measurement component of sensor output data 203 of high-performance sensor 114 to provide a final output (e.g., system output data 223) of system 201, such that the final output may leverage certain performance properties of high-performance sensor 114 and the offset stability of high-stability sensor 116. For example, as shown, system 201 may leverage one or more of a delay module 220, a difference module 222, a comparator module 224, and a trigger module 226 in conjunction with sensor output data 203 from high-performance sensor 114 and threshold output data 205 from threshold source 105 in order to determine whether or not to update calibrated offset value 107.

Delay module 220 of system 201 may be configured to receive and process at least a portion of sensor output data 203 from high-performance sensor 114 for generating and transmitting delayed sensor output data 209, where delayed sensor output data 209 may be a previous version of at least a portion of the sensor output data from high-performance sensor 114 as compared with sensor output data 203. For example, delay module 220 may be configured as a single delay step, such that sensor output data 209 and sensor output data 203 may be consecutive output data samples from high-performance sensor 114. Alternatively, delay module 220 may be configured as a delay step of any other suitable amount, such that sensor output data 209 may be an output data sample that was generated prior to sensor output data 203 by high-performance sensor 114 by any suitable sample count that may be more than one, such that sensor output data 209 and sensor output data 203 may be not be directly consecutive output data samples. For example, in some embodiments, delayed sensor output data 209 may be a moving or rolling average of multiple (e.g., 10-50) prior samples, or any other suitable approach may be used to minimize the effect of an outlier sample (e.g., an erroneous value).

Difference module 222 of system 201 may be configured to receive and process at least a portion of sensor output data 203 from high-performance sensor 114 and at least a portion of delayed sensor output data 209 from delay module 220 for generating and transmitting difference sensor output data 211, where difference sensor output data 211 may be any suitable data indicative of any difference between at least a portion of sensor output data 203 and at least a portion of delayed sensor output data 209. For example, in some embodiments, where high-performance sensor 114 may be a 3-axis magnetic sensor, sensor output data 203 and, thus, delayed sensor output data 209 may each include three magnetic property signal measurement components (e.g., one for each axis), and difference module 222 may be configured to provide difference sensor output data 209 that may include three difference values, where each difference value may be indicative of a difference between a magnetic property signal measurement component of sensor output data 203 and a magnetic property signal measurement component of delayed sensor output data 209 for a particular axis. Each difference value may be an absolute value that is a positive value regardless of which one of compared sensor output data 203 and delayed sensor output data 209 was larger than the other.

Comparator module 224 of system 201 may be configured to receive and process at least a portion of difference sensor output data 211 from difference module 222 and threshold output data 205 from threshold source 105 for generating and transmitting comparator data 213, where comparator data 213 may be any suitable data indicative of a comparison between at least a portion of difference sensor output data 211 and threshold output data 205. For example, as mentioned, difference sensor output data 211 may include data indicative of the difference between the magnetic property signal measurement components of sensor output data 203 and delayed sensor output data 209 for at least one particular axis, and comparator module 224 may be configured to compare such a difference for each of the at least one axis to threshold output data 205 and to generate either a first type of comparator data 213 when at least one such difference is greater than threshold output data 205 or a second type of comparator data 213 when such a difference is not greater than threshold output data 205. That is, when the difference between a component of current sensor output data and a component of previous sensor output data of high-performance sensor 114 (e.g., the difference between associated components of data 203 and 209 (e.g., for a particular axis)) is greater than current threshold output data 205 of threshold source 105, comparator module 224 may generate and transmit comparator data 213 of a first value and, when the difference between a component of current sensor output data and a component of previous sensor output data of high-performance sensor 114 is not greater than current threshold output data 205 of threshold source 105, comparator module 224 may generate and transmit comparator data 213 of a second value that is different than the first value. As described below, the value of threshold output data 205 of threshold source 105 may be fixed or dynamically updated to vary the performance of comparator module 224 and, thus, system 201.

Trigger module 226 of system 201 may be configured to receive and process comparator data 213 from comparator module 224 for selectively generating and transmitting trigger data 215 when comparator data 213 is the first value (e.g., when the difference between a component of current sensor output data and a component of previous sensor output data of high-performance sensor 114 is determined by comparator module 224 to be greater than current threshold output data 205). When comparator data 213 is the second value (e.g., when the difference between a component of current sensor output data and a component of previous sensor output data of high-performance sensor 114 is determined by comparator module 224 not to be greater than current threshold output data 205), trigger module 226 of system 201 may be configured to receive and process such comparator data 213 from comparator module 224 but may not generate or transmit any trigger data 215. When transmitted, trigger data 215 may be received by high-stability sensor 116 and may be configured to enable or otherwise instruct high-stability sensor 116 to generate and transmit sensor output data 207. For example, in some embodiments, prior to receiving trigger data 215, high-stability sensor 116 may be configured to be in a standby mode or any suitable low-power mode, such as a sleep mode or an altogether off mode in which high-stability sensor 116 may not be operative to generate and transmit sensor output data 207, and trigger data 215 may be operative to switch high-stability sensor 116 from such a low-power mode to a more active mode in which high-stability sensor 116 may be operative to generate and transmit sensor output data 207, which may be used by system 201 to update calibrated offset value 107. Therefore, when comparator data 213 is the first value indicative of (e.g., when the difference between a component of current sensor output data and a component of previous sensor output data of high-performance sensor 114 is determined by comparator module 224 to be greater than current threshold output data 205), system 201 may enable calibrated offset value 107 to be updated by generating and transmitting trigger data 215 from trigger module 226 to high-stability sensor 116 such that sensor output data 207 may be shared by high-stability sensor 116 with system 201 (e.g., with difference module 228).

Difference module 228 of system 201 may be configured to receive and process at least a portion of sensor output data 207 from high-stability sensor 116 and at least a portion of sensor output data 203 from high-performance sensor 114 for generating and transmitting updated offset value data 219, where updated offset value data 219 may be any suitable data indicative of any difference between at least a portion of sensor output data 207 and at least a portion of sensor output data 203. For example, in some embodiments, where sensor output data 207 from high-stability sensor 116 may include at least one magnetic property signal measurement component (e.g., one for each axis) and an offset component based on the properties of high-stability sensor 116, and where sensor output data 203 from high-performance sensor 114 may include at least one magnetic property signal measurement component (e.g., one for each axis) and an offset component based on the properties of high-performance sensor 114, difference module 228 may be configured to provide updated offset value data 219 that may include at least one magnetic property signal measurement component difference value (e.g., one for each axis of sensors 114/116) and an offset component difference value, where each magnetic property signal measurement component difference value may be indicative of a difference between a magnetic property signal measurement component of sensor output data 207 and a magnetic property signal measurement component of sensor output data 203, and where the offset component difference value may be indicative of a difference between the offset component of sensor output data 207 and the offset component of sensor output data 203. As mentioned above, in some embodiments, at any particular point in time, magnetic data 95a detected by high-performance sensor 114 may be the same as magnetic data 95b detected by high-stability sensor 116, such that a magnetic property signal measurement component of sensor output data 207 generated based on such magnetic data 95b may be the same or substantially similar to a magnetic property signal measurement component of sensor output data 203 generated based on such magnetic data 95a, such that each magnetic property signal measurement component difference value of updated offset value data 219 may be zero or substantially zero. This may enable updated offset value data 219 to include no or substantially no magnetic property signal measurement component, such that updated offset value data 219 may predominantly include an offset component difference value that may be indicative of a difference between the offset component of sensor output data 207 and the offset component of sensor output data 203. As just one example, updated offset value data 219 may be described by the following illustrative equations:

> Updated Offset Value Data 219=(i) Sensor Output Data 207−Sensor Output Data 203=(ii) (Magnetic Signal Component of Data 207 of Sensor 116+Offset Component of Data 207 of Sensor 116)−(Magnetic Signal Component of Data 203 of Sensor 114+Offset Component of Data 203 of Sensor 114)=(iii) Magnetic Signal Component of Data 207 of Sensor 116−Magnetic Signal Component of Data 203 of Sensor 114

Therefore, when each magnetic property signal measurement component of sensor output data 207 of high-stability sensor 116 is substantially equal to an associated magnetic property signal measurement component of sensor output data 203 of high-performance sensor 114, updated offset value data 219 may be indicative of the offset component of sensor output data 207 of high-stability sensor 116 less the offset component of sensor output data 203 of high-performance sensor 114, thereby enabling isolation of the different (e.g., better) offset stability of high-stability sensor 116 compared to high-performance sensor 114. It is to be understood that, in some embodiments, a noise component of each one of sensor output data 207 and sensor output data 203 may be carried over into updated offset value data 219. For example, high-performance sensor 114 may be configured to produce an output with a noise performance that may be any suitable magnitude, such as 0.2 microTesla, while high-stability sensor 116 may be configured to produce an output with a higher noise performance that may be any suitable magnitude, such as 1.2 microTesla, such that updated offset value data 219 may include a noise component of any suitable magnitude, such as 1.4 microTesla (e.g., the summation of the noise components of sensor output data 203 and sensor output data 207).

Such updated offset value data 219 may be transmitted from difference module 228 for storage as offset value 107 (e.g., for updating or otherwise overwriting any previously stored value at offset value 107). Moreover, in some embodiments, difference module 228 may also be configured to generate and transmit deactivation data 217 simultaneously with or based on transmission of updated offset value data 219. When transmitted, deactivation data 217 may be received by high-stability sensor 116 and may be configured to enable or otherwise instruct high-stability sensor 116 to switch from an active mode to a lower-power mode, thereby discontinuing generation and/or transmission of sensor output data 207 from high-stability sensor 116 to system 201. For example, in some embodiments, prior to receiving deactivation data 217, high-stability sensor 116 may be configured to be in an active mode in which high-stability sensor 116 may be operative to generate and transmit sensor output data 207 to system 201 for use in updating calibrated offset value 107 (e.g., in response to receiving trigger data 215 at high-stability sensor 116), and deactivation data 217 may be operative to switch high-stability sensor 116 from such an active state to a standby mode or any suitable low-power mode, such as a sleep mode or an altogether off mode in which high-stability sensor 116 may not be operative to generate and transmit sensor output data 207. Therefore, when updated offset value data 219 is generated and transmitted by difference module 228 for updating offset value 107 based on sensor output data 207 of high-stability sensor 116, system 201 may be configured to generate and transmit deactivation data 217 to high-stability sensor 116 for reconfiguring high-stability sensor 116 to a lower power mode, which may thereby reduce the power consumption of device 100 until new sensor output data 207 may be utilized by system 201 for once again updating offset value 107 with a new updated offset value data 219 (e.g., when the difference between a component of a current sensor output data and a component of previous sensor output data of high-performance sensor 114 is once again determined by comparator module 224 to be greater than current threshold output data 205).

Combiner module 230 of system 201 may be configured to receive and process at least a portion of sensor output data 203 from high-performance sensor 114 and current offset value data 221 (e.g., at least a portion of offset value 107) for generating and transmitting system output data 223, where system output data 223 may be any suitable data indicative of a combination of at least a portion of sensor output data 203 and at least a portion of offset value 107 for use by a receiving element (e.g., a magnetic-detection-based application 103), thereby enabling accurate and efficient measurement of a magnetic property 95 of the environment 90 of device 100. For example, in some embodiments, where sensor output data 203 from high-performance sensor 114 may include at least one magnetic property signal measurement component (e.g., one for each axis) and an offset component based on the properties of high-performance sensor 114, and where offset value 107 may include an offset component of a current or previous sensor output data 207 from high-stability sensor 116 less the offset component of an associated current or previous sensor output data 203 from high-performance sensor 114, combiner module 230 may be configured to provide system output data 223 that may include (i) at least one magnetic property signal measurement component of sensor output data 203 from high-performance sensor 114 and (ii) the combination of (a) the offset component of the current sensor output data 203 from high-performance sensor 114 and (b) the difference between (1) an offset component of a current or previous sensor output data 207 from high-stability sensor 116 of offset value 107 and (2) the offset component of an associated current or previous sensor output data 203 from high-performance sensor 114 of offset value 107, where such a combination of offset components may be substantially equal to the offset component of a current or previous sensor output data 207 from high-stability sensor 116 of offset value 107, as the offset component of an associated current or previous sensor output data 203 from high-performance sensor 114 of offset value 107 may be substantially the same as and, thereby, cancel out the offset component of the current sensor output data 203 from high-performance sensor 114. For example, offset components of high-performance sensor 114 may be relatively stable except during offset shift events (e.g., magnetization events when trigger data 215 is transmitted (e.g., when the difference between a component of current sensor output data and a component of previous sensor output data of high-performance sensor 114 is determined by comparator module 224 to be greater than current threshold output data 205)). This may enable system output data 223 to include an offset component (e.g., a calibrated offset) that is defined only by or at least substantially only by an offset component provided by high-stability sensor 116 (e.g., via offset value 107 of current offset value data 221) and that is not defined by or at least substantially not defined by an offset component provided by high-performance sensor 114, while system output data 223 may also include at least one magnetic property signal measurement component of sensor output data 203 provided by high-performance sensor 114. As just one example, system output data 223 may be described by the following illustrative equations:

System Output Data 223=(iv) Sensor Output Data 203+Offset Value Data 221=(v) (Magnetic Signal Component of Data 203 of Sensor 114+ Offset Component of Data 203 of Sensor 114)+ (Offset Component of Data 207 of Sensor 116 (from Value 107)–Offset Component of Data 203 of Sensor 114 (from Value 107))=(vi) Magnetic Signal Component of Data 203 of Sensor 114+Offset Component of Data 207 of Sensor 116 (from Value 107)

Therefore, sensor output data 223 may be indicative of both the magnetic property signal measurement component(s) of the current sensor output data 203 provided by high-performance sensor 114 to combiner module 230 as well as of the offset component of sensor output data 207 provided by high-stability sensor 116 to difference module 228 for defining offset value 107 for eventual use by combiner module 230. Therefore, the updated offset value data 219 that has been most recently generated and transmitted by difference module 228 for defining offset value 107 may be leveraged by combiner module 230 (e.g., as current offset value data 221) along with each new sensor output data 203 provided by high-performance sensor 114 to combiner module 230 for generating and transmitting new system output data 223, where the same current offset value data 221 may be leveraged by combiner module 230 for multiple consecutive instances of sensor output data 203 until new updated offset value data 219 is generated and transmitted by difference module 228 for updating offset value 107.

As mentioned, in some embodiments, a noise component of each one of sensor output data 207 and sensor output data 203 may be carried over into updated offset value data 219, and, therefore, a noise component of sensor output data 203 may also be carried over into system output data 223. For example, high-performance sensor 114 may be configured to produce an output with a noise performance that may be any suitable magnitude, such as 0.2 microTesla, while high-stability sensor 116 may be configured to produce an output with a higher noise performance that may be any suitable magnitude, such as 1.2 microTesla, such that updated offset value data 219 of system output data 223 may include a noise component of any suitable magnitude, such as 1.4 microTesla (e.g., the summation of the noise components of sensor output data 203 and sensor output data 207) and such that sensor output data 203 of system output data 223 may include a noise component of any suitable magnitude, such as 0.2 microTesla. Therefore, it is to be noted that the final calibrated offset component of system output data 223 (e.g., the offset component of sensor output data 207 provided by high-stability sensor 116 to difference module 228 for defining offset value 107 for eventual use by combiner module 230) may include a noise term due to noise contribution from both *GMS* sensor 114 and high-stability sensor 116 during calibration. However, while such a noise term may be sampled and stored by system 201 (e.g., as a portion of offset value 107), the amplitude of such a noise term (e.g., 1.4 microTesla) may be of a sufficiently low value that it may not degrade the overall system offset stability. For example, a compass application 103 may be configured to require offset stability of about 4 microTesla, whereby such noise of offset 107 may be significantly less and not degrading.

Receiving element 103 may be configured to receive and process system output data 223 for determining an appropriate useful measurement value of magnetic property 95 of environment 90. For example, receiving element 103 may have access to a signal transfer function of high-performance sensor 114 (e.g., transfer function 103a) such that receiving element 103 may be configured to re-center that signal transfer function with the offset component of system output data 223 for appropriately processing the magnetic property signal measurement component of sensor output data 203 using that re-centered signal transfer function, such that receiving element 103 may be configured to determine an appropriate useful magnetic measurement value 103b of magnetic property 95 of environment 90 based on system output data 223 and the re-centered signal transfer function of high-performance sensor 114. System output data 223 may include an offset component and a magnetic property signal measurement component (e.g., in microTesla or any suitable digital output value (e.g., 16-bit binary code)) for one or some or each applicable axis of sensor assembly 115 of device 100 (e.g., three axes for a sensor assembly 115 that may include a three-axes sensor 114 and a three-axes sensor 116). Receiving element 103 may be any suitable application or combination of applications or processing capabilities of device 100 (e.g., of processor 102) that may utilize or otherwise provide one or more suitable magnetic measurement values 103b to any suitable component or application or module of device 100 (e.g., a compass application, which may also be represented by application/receiving element 103).

As mentioned, the value of threshold output data 205 provided by threshold source 105 may be fixed or varied based on any suitable criteria or controller (e.g., based on application 103 or any other suitable instructions, as may be described below in more detail), such that threshold output data 205 may be appropriately used by comparator module 224 for detecting an offset shift event (e.g., for determining whether or not system 201 (e.g., trigger module 224) ought to activate or otherwise enable high-stability sensor 116 to generate sensor output data 207 for use in updating offset value 107). The value of threshold output data 205 may be any suitable value or range of values that may be utilized by comparator module 224 for comparison with difference sensor output data 211 in order to determine whether or not the difference between new sensor output data 203 and previous sensor output data 209 is of a magnitude that may benefit from an offset calibration of sensor assembly 115 by system 201. In some embodiments, the value of threshold output data 205 may be based on the earth's magnetic field (e.g., geomagnetic field). For example, the value of threshold output data 205 may be fixed at an average value of the earth's magnetic field (e.g., 50 microTesla) or at some factor of an average value of the earth's magnetic field (e.g., 100 microTesla, which may be two times an average value of the earth's magnetic field, or 25 microTesla, which may be half of an average value of the earth's magnetic field). Such a value of the earth's magnetic field may be pre-defined in any suitable way, such as by a manufacturer or operator of device 100 or of a portion of device 100 (e.g., of application 103, which may be configured to control threshold source 105 and, thus, the value of threshold output data 205), where the value used may be determined based on the average magnetic field of the earth in the area that device 100 is most likely to be used (e.g., in the continental United States).

As another example, the value of threshold output data 205 may be dynamically adjusted based on an estimation of the magnetic field at the current location of device 100. For example, device 100 may be configured to utilize any suitable data 55 communicated with remote server 50 to access an estimation of the magnetic field at the current location of device 100. As just one particular example, device 100 may receive data 55 that may be indicative of the current location of device 100 on earth (e.g., via any suitable GPS data), and device 100 may be configured to utilize such current location data to access an estimated value of the earth's magnetic field at that location (e.g., via a look-up table accessible to device 100, which may be local to device 100 in memory 104 and/or available to device 100 via remote server 50, where such a look-up table may include corresponding measured or estimated magnetic field values for various earth locations). As another particular example, server 50 may be configured to provide a service that may provide the estimated magnetic field of the earth at the current location of device 100 to device 100 via data 55 continuously or at the request of device 100 (e.g., server 50 may be configured to provided magnetic field data from any suitable service or network, such as the International Real-Time Magnetic Observatory Network, which may provide estimated magnetic field data that may be dependent not only on the current location of device 100 but also on any other suitable factor, such as the current time of year, the current weather, and the like that may affect the estimated current magnetic field at that location of device 100). Moreover, in some particular embodiments, an accessed estimated magnetic field of the current location of device 100 may not be based solely on the estimated magnetic field of the earth at the current location but instead may be at least partially or totally based on a known or estimated magnetic field of the current location that may be greater or less than the estimated magnetic field of the earth at that location. For example, the current location may be determined to be a train station or other particular location where a significant amount of magnetic field may exist that is distinct from the earth's magnetic field at that location (e.g., power generating stations or substations or any other locations that may have a high density magnetic field). Therefore, in some embodiments, data 55 may be received by device 100 from server 50 that may be indicative of a particular estimated magnetic field for a particular current location of device 100, which may be at least partially distinct from the magnetic field of the earth at that location. In some embodiments, for example, data 55 may be a geofence notice that may be generated and transmitted by server 50 of a location-based service that may provide the estimated magnetic field of the current location of device 100 to device 100. Therefore, device 100 may be configured to dynamically update the value of threshold output data 205 based on an accessed estimated magnetic field of the current location of device 100. The value of threshold output data 205 may be dynamically set to be equal to such an accessed estimated magnetic field of the current location of device 100 or may be dynamically set to be a certain factor or fraction of such an accessed estimated magnetic field of the current location of device 100.

In some embodiments, device 100 may be configured to set the value of threshold output data 205 based on various other suitable factors in addition to or as an alternative to a pre-defined estimated magnetic field or an accessed estimated magnetic field of the current location of device 100. For example, in order to save power (e.g., to limit the use of high-stability sensor 116, which may operate with a higher power consumption than high-performance sensor 114), the value of threshold output data 205 may be increased (e.g., to double the pre-defined or accessed estimated magnetic value). This may be done in response to a user's interaction with device 100 (e.g., through manual user setting) or automatically by device 100 (e.g., when the charge level of a battery of power supply 108 is low and device 100 enters a power-conservation mode). Alternatively, in order to increase the accuracy of sensor assembly 115 (e.g., by leveraging the high stability offset of high-stability sensor 116 as much as necessary), the value of threshold output data 205 may be decreased (e.g., to equal or half of the pre-defined or accessed estimated magnetic value, if not all the way to a zero value). This may be done in response to a user's interaction with device 100 (e.g., through manual user setting) or automatically by device 100 (e.g., when certain magnetic readings of sensor assembly 115 are deemed untrustworthy or any other situations where device 100 may be configured to call for offset calibration). Alternatively or additionally, device 100 may be configured to define the value of threshold output data 205 based on various other suitable factors, such as characteristics of high-performance sensor 114 and/or characteristics of high-stability sensor 116 and/or characteristics of any other suitable component of device 100. For example, the offset shift of sensor 114 may be factored into a determination of threshold output data 205. Additionally or alternatively, the existence and/or position of various other components of device 100 (e.g., components that may generate electromagnetic interference, such as an audio speaker output component, a high electric current power converter, a central processing unit, ferromagnetic materials, and the like) may be factored into a determination of threshold output data 205.

Therefore, a value of threshold output data 205 may be based on an estimated value of the magnetic field of the earth or location at which device 100 may be positioned, which may be pre-defined or dynamically updated (e.g., via data 55 from one or more remote servers 50), for defining the situations when system 201 may calibrate or otherwise update offset value 107. An increased value of threshold output data 205 may reduce the number of situations in which system 201 may calibrate or otherwise update the offset value, thereby reducing the power consumption of device 100 and/or thereby reducing the effect of any low performance characteristic of high-stability sensor 116 compared to a respective high performance characteristic of high-performance sensor 114, while a decreased value of threshold output data 205 may increase the number of situations in which system 201 may calibrate or otherwise update the offset value, thereby increasing the effect of the high offset stability of high-stability sensor 116. The value of threshold output data 205 may be managed by device 100 (e.g., by application 103) in order to maximize the offset stability of the magnetic sensing ability of device 100 while minimizing the power consumption and/or any other undesirable effect of high-stability sensor 116. A zero value or negative value setting for threshold output data 205 may ensure that system 201 may continuously calibrate or otherwise update the offset value at each cycle of sensor output data 203 of high-performance sensor 114, yet while continuously activating or keeping active high-stability sensor 116.

Figure 3:
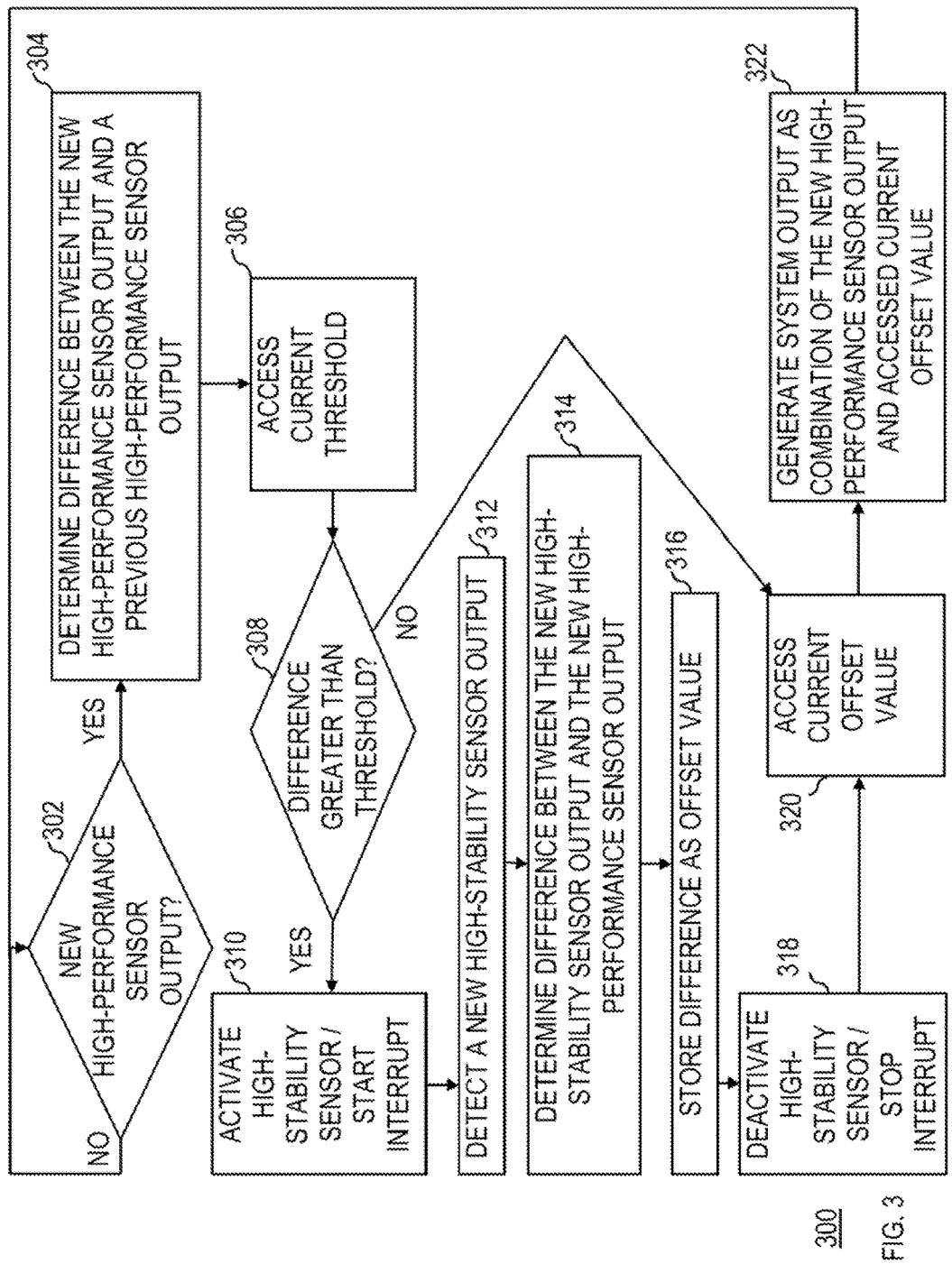
FIGS. 3-6 are flowcharts of illustrative processes for calibrating the offset of a magnetometer sensor assembly.

Description of FIG. 3

FIG. 3 is a flowchart of an illustrative process 300 for calibrating the offset of a magnetometer assembly. At step 302 of process 300, it may be determined whether or not a new high-performance sensor output has been provided by a high-performance sensor. For example, as described above with respect to FIG. 2, system 201 may be configured to determine whether or not new sensor output data 203 has been received from high-performance sensor 114 of sensor assembly 115. If it is determined at step 302 that a new high-performance sensor output has not been provided by a high-performance sensor, process 300 may repeat step 302. However, if it is determined at step 302 that a new high-performance sensor output has been provided by a high-performance sensor, process 300 may determine a difference between the new high-performance sensor output and a previous high-performance sensor output at step 304. For example, as described above with respect to FIG. 2, difference module 222 of system 201 may be configured to determine difference sensor output data 211, where difference sensor output data 211 may be any suitable data indicative of any difference between at least a portion of sensor output data 203 of high-performance sensor 114 and at least a portion of a previous sensor output of high-performance sensor 114 (e.g., delayed sensor output data 209).

After step 304, process 300 may access a current threshold value at step 306 and may determine at step 308 whether or not the determined difference of step 304 is greater than the accessed threshold value of step 306. For example, as described above with respect to FIG. 2, comparator module 224 of system 201 may be configured to receive and process at least a portion of difference sensor output data 211 from difference module 222 and threshold output data 205 from threshold source 105 for generating and transmitting comparator data 213, where comparator data 213 may be any suitable data indicative of a comparison between at least a portion of difference sensor output data 211 and threshold output data 205. If it is determined at step 308 that the difference of step 304 (i.e., the difference between the new high-performance sensor output of step 302 and a previous high-performance sensor output) is not greater than the accessed threshold value of step 306, process 300 may access a current offset value at step 320 and may generate a system output at step 322 as a combination of the new high-performance sensor output of step 302 and the value of the current offset of step 320. For example, as described above with respect to FIG. 2, combiner module 230 of system 201 may be configured to receive and process at least a portion of sensor output data 203 from high-performance sensor 114 and current offset value data 221 (e.g., at least a portion of offset value 107) for generating and transmitting system output data 223, where system output data 223 may be any suitable data indicative of a combination of at least a portion of sensor output data 203 and at least a portion of offset value 107 for use by a receiving element (e.g., a magnetic-detection-based application 103). However, if it is determined at step 308 that the difference of step 304 (i.e., the difference between the new high-performance sensor output of step 302 and a previous high-performance sensor output) is greater than the accessed threshold value of step 306, process 300 may activate a high-stability sensor and/or start an interrupt process at step 310 and may detect at step 312 a new high-stability sensor output from the high-stability sensor. For example, as described above with respect to FIG. 2, comparator module 224 of system 201 may be configured to receive and process at least a portion of difference sensor output data 211 from difference module 222 and threshold output data 205 from threshold source 105 for generating and transmitting comparator data 213, where comparator data 213 may be any suitable data indicative of a comparison between at least a portion of difference sensor output data 211 and threshold output data 205, while trigger module 226 of system 201 may be configured to receive and process comparator data 213 from comparator module 224 for selectively generating and transmitting trigger data 215 when comparator data 213 is a first value (e.g., when the difference between a component of current sensor output data and a component of previous sensor output data of high-performance sensor 114 is determined by comparator module 224 to be greater than current threshold output data 205), and, when transmitted, trigger data 215 may be received by high-stability sensor 116 and may be configured to enable or otherwise instruct high-stability sensor 116 to be activated or otherwise enabled to generate and transmit sensor output data 207.

After step 312, process 300 may determine the difference between the new high-stability sensor output of step 312 and the new high-performance sensor output of step 302 at step 314 (e.g., subtract the new high-performance sensor output of step 302 from the new high-stability sensor output of step 312). For example, as described above with respect to FIG. 2, difference module 228 of system 201 may be configured to receive and process at least a portion of sensor output data 207 from high-stability sensor 116 and at least a portion of sensor output data 203 from high-performance sensor 114 for generating and transmitting updated offset value data 219, where updated offset value data 219 may be any suitable data indicative of any difference between at least a portion of sensor output data 207 and at least a portion of sensor output data 203. Then, process 300 may store the determined difference of step 314 at step 316 and, at step 318, may deactivate the high-stability sensor enabled at step 310 and/or stop the interrupt process started at step 310. For example, as described above with respect to FIG. 2, difference module 228 of system 201 may be configured to receive and process at least a portion of sensor output data 207 from high-stability sensor 116 and at least a portion of sensor output data 203 from high-performance sensor 114 for generating and transmitting updated offset value data 219, where updated offset value data 219 may be any suitable data indicative of any difference between at least a portion of sensor output data 207 and at least a portion of sensor output data 203, and where such updated offset value data 219 may be transmitted from difference module 228 for storage as offset value 107 (e.g., for updating or otherwise overwriting any previously stored value at offset value 107), while difference module 228 may also be configured to generate and transmit deactivation data 217 simultaneously with or based on transmission of updated offset value data 219, where such deactivation data 217, when transmitted, may be received by high-stability sensor 116 and may be configured to enable or otherwise instruct high-stability sensor 116 to switch from an active mode to a lower-power mode, thereby discontinuing generation and/or transmission of sensor output data 207 from high-stability sensor 116 to system 201. Then, after step 316 and/or after step 318, process 300 may access a current offset value at step 320 (e.g., the value of the difference of step 314 as stored at step 316) and may generate a system output at step 322 as a combination of the new high-performance sensor output of step 302 and the value of the offset accessed at step 320. For example, as described above with respect to FIG. 2, combiner module 230 of system 201 may be configured to receive and process at least a portion of sensor output data 203 from high-performance sensor 114 and current offset value data 221 (e.g., at least a portion of offset value 107) for generating and transmitting system output data 223, where system output data 223 may be any suitable data indicative of a combination of at least a portion of sensor output data 203 and at least a portion of offset value 107 for use by a receiving element (e.g., a magnetic-detection-based application 103).

In some embodiments, step 310 may start an interrupt routine or may otherwise suspend a portion of the functionality of process 300 (e.g., of device 100) until a complementary stop interrupt occurs (e.g., at step 318). For example, during such an interrupt or suspend period, the value of offset value 107 may be updated (e.g., via steps 312-316) and the generation or sharing of a system output (e.g., at step 322) may be suspended, such that a previously stored offset value may not be used in combination with high-performance sensor data received during the interrupt for driving a system output. In other embodiments, the frequency of a high-performance sensor (e.g., the time between consecutive instances of sensor output data 203 generated by high-performance sensor 114) may be configured such that each one of steps 304-322 may be performed between the receipt of consecutive instances of sensor output data 203 from high-performance sensor 114 (e.g., at step 302). For example, the frequency of high-performance sensor 114 may be any suitable magnitude, such as 100 hertz such that two consecutive instances of sensor output data 203 may be 10 milliseconds apart, and device 100 may be configured such that steps 304-322 of process 300 may be at least partially performed within the 10 milliseconds between receipt of consecutive high-performance sensor outputs at step 302.

It is understood that the steps shown in process 300 of FIG. 3 are merely illustrative and that existing steps may be modified or omitted, additional steps may be added, and the order of certain steps may be altered.

Figure 4:
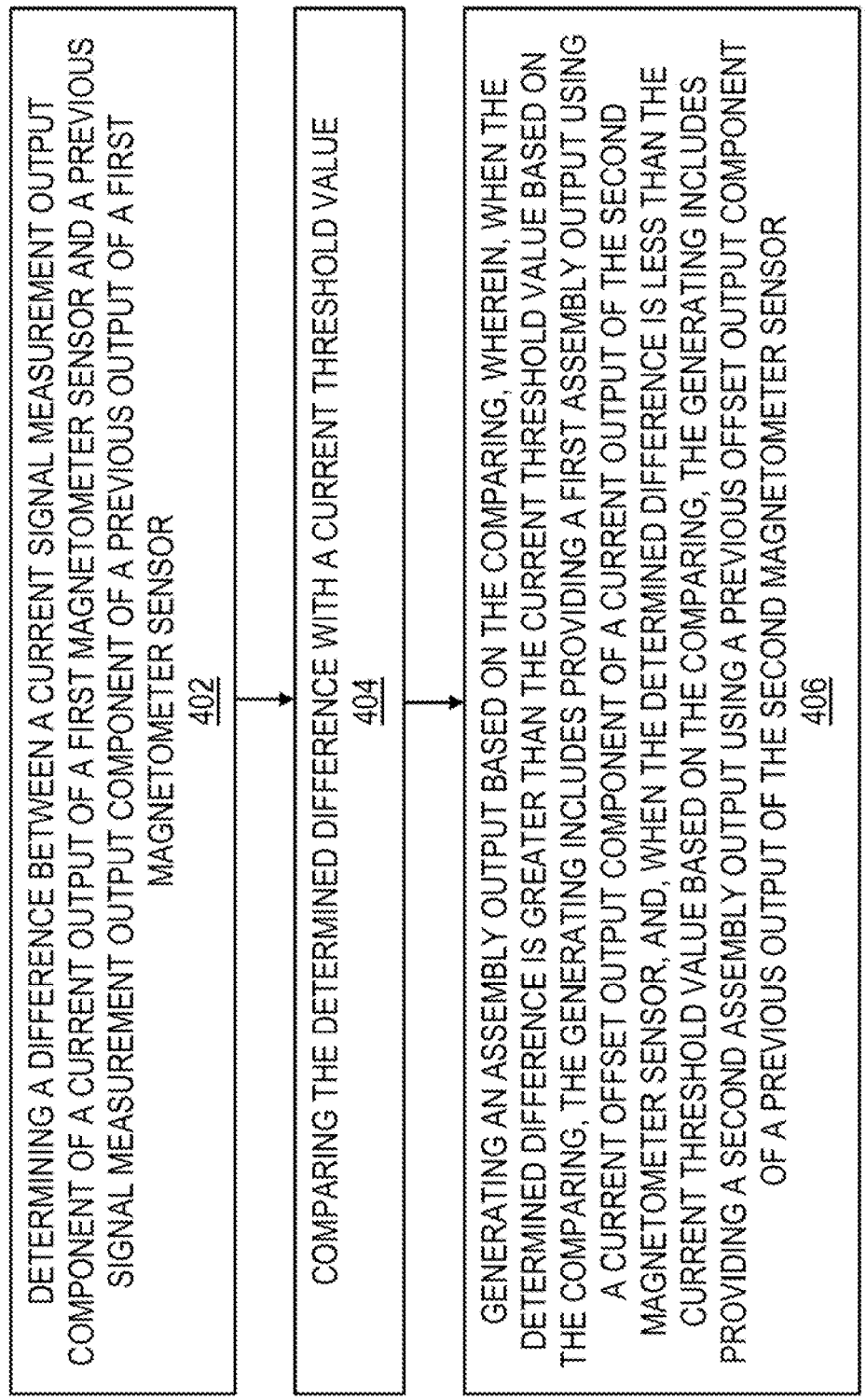

Description of FIG. 4

FIG. 4 is a flowchart of an illustrative process 400 for operating an assembly, such as magnetometer sensor assembly 115 (e.g., for calibrating the offset of the magnetometer assembly). At step 402, process 400 may include determining a difference between a current signal measurement output component of a current output of a first magnetometer sensor of the assembly and a previous signal measurement output component of a previous output of the first magnetometer sensor. For example, as described above with respect to FIG. 2, difference module 222 of system 201 may be configured to determine difference sensor output data 211, where difference sensor output data 211 may be any suitable data indicative of any difference between at least a portion of sensor output data 203 of high-performance sensor 114 and at least a portion of a previous sensor output of high-performance sensor 114 (e.g., delayed sensor output data 209). Next, at step 404, process 400 may include comparing the determined difference with a current threshold value, and, then, at step 406, process 400 may include generating an assembly output based on the comparing of step 404, wherein, when the determined difference is greater than the current threshold value based on the comparing of step 404, the generating of step 406 may include providing a first assembly output using a current offset output component of a current output of a second magnetometer sensor of the assembly, and, when the determined difference is less than the current threshold value based on the comparing of step 404, the generating of step 406 may include providing a second assembly output using a previous offset output component of a previous output of the second magnetometer sensor. For example, as described above with respect to FIG. 2, comparator module 224 of system 201 may be configured to receive and process at least a portion of difference sensor output data 211 from difference module 222 and threshold output data 205 from threshold source 105 for generating and transmitting comparator data 213, where comparator data 213 may be any suitable data indicative of a comparison between at least a portion of difference sensor output data 211 and threshold output data 205, while sensor output data 223 may be indicative of both the magnetic property signal measurement component(s) of the current sensor output data 203 provided by high-performance sensor 114 to combiner module 230 as well as of the offset component of sensor output data 207 provided by high-stability sensor 116 to difference module 228 for defining offset value 107 for eventual use by combiner module 230, such that the updated offset value data 219 that has been most recently generated and transmitted by difference module 228 for defining offset value 107 may be leveraged by combiner module 230 (e.g., as current offset value data 221) along with each new sensor output data 203 provided by high-performance sensor 114 to combiner module 230 for generating and transmitting new system output data 223, where the same current offset value data 221 may be leveraged by combiner module 230 for multiple consecutive instances of sensor output data 203 until new updated offset value data 219 is generated and transmitted by difference module 228 for updating offset value 107 (e.g., in response to a particular type of comparator data 213 being received by trigger module 226).

It is understood that the steps shown in process 400 of FIG. 4 are merely illustrative and that existing steps may be modified or omitted, additional steps may be added, and the order of certain steps may be altered.

Figure 5:
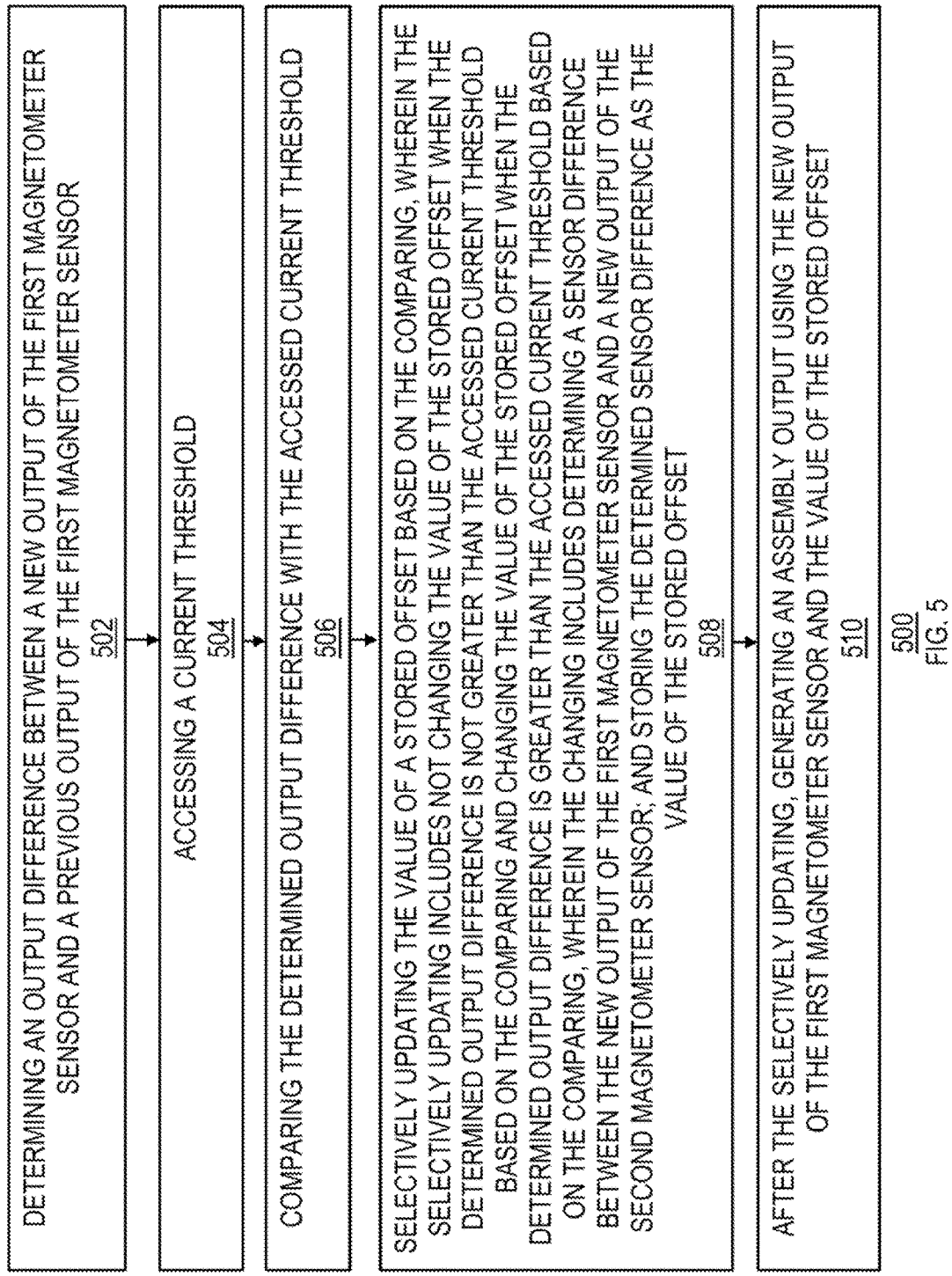

Description of FIG. 5

FIG. 5 is a flowchart of an illustrative process 500 for operating an assembly, such as magnetometer sensor assembly 115 (e.g., for calibrating the offset of the magnetometer assembly). At step 502, process 500 may include determining an output difference between a new output of a first magnetometer sensor of the assembly and a previous output of the first magnetometer sensor. For example, as described above with respect to FIG. 2, difference module 222 of system 201 may be configured to determine difference sensor output data 211, where difference sensor output data 211 may be any suitable data indicative of any difference between at least a portion of sensor output data 203 of high-performance sensor 114 and at least a portion of a previous sensor output of high-performance sensor 114 (e.g., delayed sensor output data 209). Next, at step 504, process 500 may include accessing a current threshold, and, then, at step 506, process 500 may include comparing the determined output difference of step 502 with the accessed current threshold of step 504. For example, as described above with respect to FIG. 2, comparator module 224 of system 201 may be configured to receive and process at least a portion of difference sensor output data 211 from difference module 222 and threshold output data 205 from threshold source 105 for generating and transmitting comparator data 213, where comparator data 213 may be any suitable data indicative of a comparison between at least a portion of difference sensor output data 211 and threshold output data 205. Next, at step 508, process 500 may include selectively updating the value of a stored offset based on the comparing of step 506, where the selectively updating of step 508 may include not changing the value of the stored offset when the determined output difference of step 502 is not greater than the accessed current threshold of step 504 based on the comparing of step 506, and changing the value of the stored offset when the determined output difference of step 502 is greater than the accessed current threshold of step 504 based on the comparing of step 506, where the changing may include determining a sensor difference between the new output of the first magnetometer sensor and a new output of a second magnetometer sensor of the assembly and storing the determined sensor difference as the value of the stored offset. For example, as described above with respect to FIG. 2, in response to a particular type of comparator data 213 being received by trigger module 226, difference module 228 of system 201 may be configured to receive and process at least a portion of sensor output data 207 from high-stability sensor 116 and at least a portion of sensor output data 203 from high-performance sensor 114 for generating and transmitting updated offset value data 219, where updated offset value data 219 may be any suitable data indicative of any difference between at least a portion of sensor output data 207 and at least a portion of sensor output data 203. At step 510, after the selectively updating of step 508, process 500 may include generating an assembly output using the new output of the first magnetometer sensor and the value of the stored offset. For example, as described above with respect to FIG. 2, sensor output data 223 of system 201 may be indicative of both the magnetic property signal measurement component(s) of the current sensor output data 203 provided by high-performance sensor 114 to combiner module 230 as well as of the offset component of sensor output data 207 provided by high-stability sensor 116 to difference module 228 for defining offset value 107 for eventual use by combiner module 230, such that the updated offset value data 219 that has been most recently generated and transmitted by difference module 228 for defining offset value 107 may be leveraged by combiner module 230 (e.g., as current offset value data 221) along with each new sensor output data 203 provided by high-performance sensor 114 to combiner module 230 for generating and transmitting new system output data 223, where the same current offset value data 221 may be leveraged by combiner module 230 for multiple consecutive instances of sensor output data 203 until new updated offset value data 219 is generated and transmitted by difference module 228 for updating offset value 107 (e.g., in response to a particular type of comparator data 213 being received by trigger module 226).

It is understood that the steps shown in process 500 of FIG. 5 are merely illustrative and that existing steps may be modified or omitted, additional steps may be added, and the order of certain steps may be altered.

Figure 6:
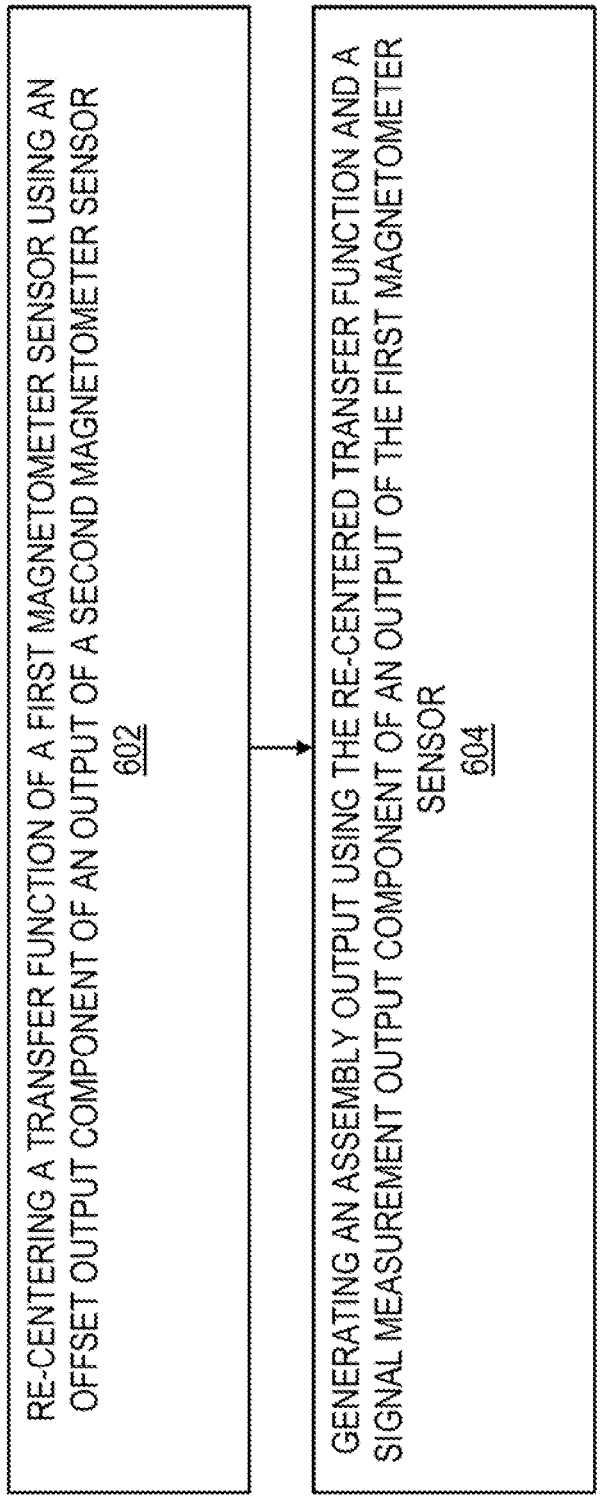

Description of FIG. 6

FIG. 6 is a flowchart of an illustrative process 600 for operating an assembly, such as magnetometer sensor assembly 115 (e.g., for calibrating the offset of the magnetometer assembly). At step 602, process 600 may include re-centering a transfer function of a first magnetometer sensor of the assembly using an offset output component of an output of a second magnetometer sensor of the assembly. For example, as described above with respect to FIG. 2, receiving element 103 may have access to a signal transfer function of high-performance sensor 114 (e.g., transfer function 103a) such that receiving element 103 may be configured to re-center that signal transfer function with the offset component of system output data 223, which may include an offset component of sensor output data 207 of high-stability sensor 116. Next, at step 604, process 600 may include generating an assembly output using the re-centered transfer function and a signal measurement output component of an output of the first magnetometer sensor. For example, as described above with respect to FIG. 2, receiving element 103 may be configured to generate an appropriate useful magnetic measurement value 103b of magnetic property 95 of environment 90 using re-centered transfer function 103a and a magnetic property signal measurement component of sensor output data 203 of high-performance sensor 114 (e.g., as may be included in system output data 223 received by receiving element 103).

It is understood that the steps shown in process 600 of FIG. 6 are merely illustrative and that existing steps may be modified or omitted, additional steps may be added, and the order of certain steps may be altered.

Further Applications of Described Concepts

One, some, or all of the processes described with respect to FIGS. 1-6 may each be implemented by software, but may also be implemented in hardware, firmware, or any combination of software, hardware, and firmware. Instructions for performing these processes may also be embodied as machine- or computer-readable code recorded on a machine- or computer-readable medium. In some embodiments, the computer-readable medium may be a non-transitory computer-readable medium. Examples of such a non-transitory computer-readable medium include but are not limited to a read-only memory, a random-access memory, a flash memory, a CD-ROM, a DVD, a magnetic tape, a removable memory card, and a data storage device (e.g., memory 104 of FIG. 1). In other embodiments, the computer-readable medium may be a transitory computer-readable medium. In such embodiments, the transitory computer-readable medium can be distributed over network-coupled computer systems so that the computer-readable code is stored and executed in a distributed fashion. For example, such a transitory computer-readable medium may be communicated from one electronic device to another electronic device using any suitable communications protocol (e.g., the computer-readable medium may be communicated from a remote device as data 55 to electronic device 100 via communications component 106 (e.g., as at least a portion of an application 103). Such a transitory computer-readable medium may embody computer-readable code, instructions, data structures, program modules, or other data in a modulated data signal, such as a carrier wave or other transport mechanism, and may include any information delivery media. A modulated data signal may be a signal that has one or more of its characteristics set or changed in such a manner as to encode information in the signal.

It is to be understood that any, each, or at least one module or component or element or subsystem of device 100 (e.g., of system 201) may be provided as a software construct, firmware construct, one or more hardware components, or a combination thereof. For example, any, each, or at least one module or component or element or subsystem of device 100 (e.g., of system 201) may be described in the general context of computer-executable instructions, such as program modules, that may be executed by one or more computers or other devices. Generally, a program module may include one or more routines, programs, objects, components, and/or data structures that may perform one or more particular tasks or that may implement one or more particular abstract data types. It is also to be understood that the number, configuration, functionality, and interconnection of the modules and components and elements and subsystems of device 100 (e.g., of system 201) are merely illustrative, and that the number, configuration, functionality, and interconnection of existing modules, components, elements, and/or subsystems of device 100 (e.g., of system 201) may be modified or omitted, additional modules, components, elements, and/or subsystems of device 100 (e.g., of system 201) may be added, and the interconnection of certain modules, components, elements, and/or subsystems of device 100 (e.g., of system 201) may be altered.

At least a portion of one or more of the modules or components or elements or subsystems of device 100 may be stored in or otherwise accessible to an entity of system 1 in any suitable manner (e.g., in memory 104 of device 100 (e.g., as at least a portion of an application 103). For example, any or each module of system 201 and/or element 103 and/or sensors 114 and 116 may be implemented using any suitable technologies (e.g., as one or more integrated circuit devices), and different modules may or may not be identical in structure, capabilities, and operation. Any or all of the modules or other components of device 100 may be mounted on an expansion card, mounted directly on a system motherboard, or integrated into a system chipset component (e.g., into a "north bridge" chip).

Any or each module or component of device 100 may be a dedicated system implemented using one or more expansion cards adapted for various bus standards. For example, all of the modules may be mounted on different interconnected expansion cards or all of the modules may be mounted on one expansion card. With respect to system 201, by way of example only, the modules of system 201 and/or element 103 and/or sensors 114 and 116 may interface with a motherboard or processor 102 of device 100 through an expansion slot (e.g., a peripheral component interconnect ("PCI") slot or a PCI express slot). Alternatively, system 201 and/or element 103 and/or sensors 114 and 116 need not be removable but may include one or more dedicated modules that may include memory (e.g., RAM) dedicated to the utilization of the module. In other embodiments, system 201 and/or element 103 and/or sensors 114 and 116 may be integrated into device 100. For example, a module of system 201 and/or any intelligence that may be associated with one or more of element 103 and/or sensors 114 and 116 may utilize a portion of device memory 104 of device 100. Any or each element or module or component of device 100 (e.g., any or each module of system 201 and/or sensors 114 and 116) may include its own processing circuitry and/or memory. Alternatively, any or each module or component of device 100 (e.g., any or each module of system 201 and/or element 103 and/or sensors 114 and 116) may share processing circuitry and/or memory with any other module of system 201 and/or sensors 114 and 116 and/or element 103 and/or processor 102 and/or memory 104 and/or source 105 and/or value 107 of device 100.

A hybrid magnetometer assembly with at least one high-performance sensor 114 and at least one high-stability sensor 116, as described above, may be implemented using one of various approaches that may differ from one another in one or more ways, such as with respect to where certain intelligence or processing capabilities of the assembly may lie. In some embodiments, a first implementation approach may include utilizing at least two distinct chips or packages, each of which may include at least one magnetic property sensor and at least one integrated circuit. For example, high-performance sensor 114 may be provided as an independent package that may include one or more integrated circuits or gate arrays as well as one or more magnet sensors or sensing elements with one or more leads or I/O ports that may be coupled to particular ports of each integrated circuit or gate array. Similarly, high-stability sensor 116 may be provided as an independent package that may include one or more integrated circuits or gate arrays as well as one or more magnet sensors or sensing elements with one or more leads or I/O ports that may be coupled to particular ports of each integrated circuit or gate array. Each independent package may include one or more integrated circuits (e.g., an application specific integrated circuit ("ASIC")), which may include one or more microprocessors, memory components, and the like, which may be interconnected in any suitable way (e.g., for forming a system-on-chip), while any suitable language (e.g., a hardware description language, such as Verilog or VHDL) may be utilized to describe the functionality of an integrated circuit. Alternatively or additionally, each independent package may include one or more gate arrays (e.g., a field-programmable gate array ("FPGA")), which may leverage one or more programmable logic blocks and/or programmable interconnects for providing functionality to that package. Each one of such packages may be configured to act independently (e.g., such that a first package may fully function even when a second package may be disabled, suspended, held in a low power mode, etc.). In such an implementation, device 100 may be configured such that system software (e.g., any of the potential software described above, such as with respect to application 103 and/or system 201 or process 300) may be utilized to provide sensor fusion and/or integration between an independent high-performance sensor package providing high-performance sensor 114 and an independent high-stability sensor package providing high-stability sensor 116. Such an implementation may obviate the need for the development of any integration (e.g., hardware integration of sensor components). However, such an implementation may prevent the sensing elements of a first package from being positioned within a certain distance of the sensing elements of a second package (e.g., due to the geometry of each independent chip or package, as they may not be monolithically integrated), which may result in different magnetic data (e.g., magnetic data 95a and magnetic data 95b) being detected by the sensing elements of the different packages.

In other embodiments, a second implementation approach may include utilizing at least one distinct chip or package as well as one or more independent sensing elements with no intelligence. For example, high-performance sensor 114 may be provided as an independent package that may include one or more integrated circuits or gate arrays as well as one or more magnet sensors or sensing elements with one or more leads or I/O ports that may be coupled to particular ports of each integrated circuit or gate array, while high-stability sensor 116 may be provided by providing one or more sensing elements that are not in a package but that may be individually coupled to the intelligence of the high-performance package (e.g., to one or more of the integrated circuits or gate arrays of the high-performance package). In such an embodiment, the independent package that may provide high-performance sensor 114 may be considered primary or active, while the one or more sensing elements that may provide high-stability sensor 116 may be considered dumb or passive. Alternatively, high-stability sensor 116 may be provided as primary or active with an independent package while high-performance sensor 114 may be provided dumb passive with as one or more sensing elements. In any event, leads or ports of the one or more independent sensing elements of the passive sensor may be coupled to the intelligence of the active package (e.g., to one or more of the integrated circuits or gate arrays of the package), and the intelligence of the active package may be programmed or otherwise configured to interpret outputs from not only the sensing elements of the active package but also from the sensing elements of the passive sensor. Such an implementation may allow the independent sensing elements of the passive sensor to be positioned closer to the sensing elements of the active package (e.g., the passive sensing elements may be interspersed along the outside of the active chip or package in an efficient arrangement to minimize the distance between the passive sensing elements and the sensing elements within the active package). However, such an implementation may require the intelligence of the active package to support the passive sensing elements.

In other embodiments, a third implementation approach may include utilizing a monolithic integration of at least two sensors in a fully integrated monolithic single package. For example, one or more sensing elements that may provide the sensing for high-performance sensor 114 may be integrated with one or more sensing elements that may provide the sensing for high-stability sensor 116 into the same package or chips with intelligence that may support both types of sensing elements. Such an implementation may allow the independent sensing elements of the two sensors to be positioned closer to one another within the single package, and/or certain components of the intelligence of the package (e.g., one or more of the integrated circuits or gate arrays of the package) may be customized such that they may be shared by and utilized for the sensing elements of both sensor types. However, such an implementation may increase the complexity of the integration and the size of the package may be increased.

While there have been described systems, methods, and computer-readable media for calibrating the offset of a magnetometer assembly with reduced power, it is to be understood that many changes may be made therein without departing from the spirit and scope of the subject matter described herein in any way. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

Therefore, those skilled in the art will appreciate that the invention can be practiced by other than the described embodiments, which are presented for purposes of illustration rather than of limitation.

What is claimed is:

1. An electronic device comprising:
 a sensor assembly comprising:
  a first magnetometer sensor; and
  a second magnetometer sensor; and
 a sensor management system operative to:
  determine a difference between a current output of the first magnetometer sensor and a previous output of the first magnetometer sensor;
  determine a current threshold value;
  compare the determined difference with the determined current threshold value; and
  generate a system output based on the comparison, wherein:
   when the determined difference is greater than the determined current threshold value based on the comparison, the sensor management system is operative to activate the second magnetometer sensor in order to generate the system output using an offset output component of a current output of the second magnetometer sensor; and
   when the determined difference is not greater than the determined current threshold value based on the comparison, the sensor management system is operative to generate the system output using an offset output component of a previous output of the second magnetometer sensor.

2. The electronic device of claim 1, wherein the determined current threshold value is based on the magnetic field of the earth at a current location of the electronic device.

3. The electronic device of claim 1, wherein the sensor management system is operative to determine the current threshold value using a data source remote from the electronic device.

4. The electronic device of claim 1, wherein, when the determined difference is not greater than the determined current threshold value based on the comparison, the sensor management system is operative to generate the system output by combining the current output of the first magnetometer sensor and the offset output component of the previous output of the second magnetometer sensor.

5. The electronic device of claim 1, wherein the sensor management system is further operative to de-activate the second magnetometer sensor after the system output is generated using the offset output component of the current output of the second magnetometer sensor.

6. The electronic device of claim 1, wherein the second magnetometer sensor has greater offset stability than the first magnetometer sensor.

7. The electronic device of claim 1, wherein the first magnetometer sensor operates with a lower power consumption than the second magnetometer sensor.

8. The electronic device of claim 1, wherein:
 the first magnetometer sensor is provided on the electronic device as a first package comprising at least one first sensing element and at least one first intelligence component;
 the second magnetometer sensor is provided on the electronic device as a second package comprising at least one second sensing element and at least one second intelligence component; and
 the first package is operable independent of the second package.

9. The electronic device of claim 1, wherein:
 the first magnetometer sensor is provided on the electronic device as a package comprising at least one active sensing element and at least one intelligence component;
 the second magnetometer sensor is provided on the electronic device as at least one passive sensing element; and
 the intelligence component of the package is operative to interpret outputs from the at least one active sensing element and the at least one passive sensing element.

10. The electronic device of claim 1, wherein:
 the first magnetometer sensor comprises at least one first sensing element;
 the second magnetometer sensor comprises at least one second sensing element; and
 the electronic device further comprises a fully integrated monolithic single package comprising:
  the first magnetometer sensor;
  the second magnetometer sensor; and at least one intelligence component that is operative to interpret outputs from the at least one first sensing element and outputs from the at least one second sensing element.

11. A method for operating an assembly that comprises a first magnetometer sensor and a second magnetometer sensor, the method comprising:
    determining a difference between a current signal measurement output component of a current output of the first magnetometer sensor and a previous signal measurement output component of a previous output of the first magnetometer sensor;
    comparing the determined difference with a current threshold value; and
    generating an assembly output based on the comparing, wherein:
        when the determined difference is greater than the current threshold value based on the comparing, the generating comprises providing a first assembly output using a current offset output component of a current output of the second magnetometer sensor;
        when the determined difference is less than the current threshold value based on the comparing, the generating comprises providing a second assembly output using a previous offset output component of a previous output of the second magnetometer sensor; and
        the first magnetometer sensor operates with a lower power consumption than the second magnetometer sensor.

12. The method of claim 11, wherein the second magnetometer sensor has greater offset stability than the first magnetometer sensor.

13. The method of claim 11, wherein the current threshold value is based on the magnetic field of the earth at the current location of the assembly.

14. The method of claim 11, wherein:
    the second magnetometer sensor has greater offset stability than the first magnetometer sensor.

15. The method of claim 11, wherein the providing the second assembly output comprises combining the current signal measurement output component of the current output of the first magnetometer sensor and the previous offset output component of the previous output of the second magnetometer sensor.

16. The method of claim 11, further comprising, after the comparing but before the generating, detecting the current offset output component of the current output of the second magnetometer sensor when the determined difference is greater than the current threshold value based on the comparing.

17. The method of claim 16, wherein the providing the first assembly output comprises combining the current signal measurement output component of the current output of the first magnetometer sensor and the current offset output component of the current output of the second magnetometer sensor.

18. The method of claim 16, wherein:
    the first assembly output comprises the current signal measurement output component of the current output of the first magnetometer sensor and the current offset output component of the current output of the second magnetometer sensor;
    the second assembly output comprises the current signal measurement output component of the current output of the first magnetometer sensor and the previous offset output component of the previous output of the second magnetometer sensor; and the method further comprises:
    re-centering a transfer function of the first magnetometer sensor using the offset output component of the generated assembly output; and
    determining an assembly measurement using the re-centered transfer function and the signal measurement output component of the generated assembly output.

19. The method of claim 16, further comprising, after the comparing but before the detecting, activating the second magnetometer sensor when the determined difference is greater than the current threshold value based on the comparing.

20. The method of claim 19, further comprising, after the detecting but before the generating, de-activating the second magnetometer sensor when the determined difference is greater than the current threshold value based on the comparing.

21. A method for operating an assembly that comprises a first magnetometer sensor and a second magnetometer sensor, the method comprising:
    determining an output difference between a new output of the first magnetometer sensor and a previous output of the first magnetometer sensor;
    accessing a current threshold;
    comparing the determined output difference with the accessed current threshold;
    selectively updating a value of a stored offset based on the comparing, wherein the selectively updating comprises:
        not changing the value of the stored offset when the determined output difference is not greater than the accessed current threshold based on the comparing; and
        changing the value of the stored offset when the determined output difference is greater than the accessed current threshold based on the comparing, wherein the changing comprises:
            determining a sensor difference between the new output of the first magnetometer sensor and a new output of the second magnetometer sensor; and
            storing the determined sensor difference as the value of the stored offset; and
    after the selectively updating, generating an assembly output using the new output of the first magnetometer sensor and the value of the stored offset, wherein the changing further comprises de-activating the second magnetometer sensor after the determining the sensor difference and before the generating the assembly output.

22. The method of claim 21, wherein the changing further comprises activating the second magnetometer sensor after the comparing and before the determining the sensor difference.

23. The method of claim 21, wherein the second magnetometer sensor has greater offset stability than the first magnetometer sensor.

24. The method of claim 21, wherein the first magnetometer sensor operates with a lower power consumption than the second magnetometer sensor.

25. The method of claim 21, wherein:
    the value of the stored offset comprises an offset output component of an output of the second magnetometer sensor; and
    the generated assembly output comprises:
        a signal measurement output component of the new output of the first magnetometer sensor; and
        the offset output component.

26. The method of claim 25, wherein the method further comprises:
- re-centering a transfer function of the first magnetometer sensor using the offset output component of the generated assembly output; and
- determining an assembly measurement using the re-centered transfer function and the signal measurement output component of the generated assembly output.

27. A hybrid magnetometer sensor assembly comprising:
a first magnetometer sensor; and
a second magnetometer sensor, wherein the assembly is operative to:
- re-center a transfer function of the first magnetometer sensor using an offset output component of an output of the second magnetometer sensor; and
- generate an assembly output using the re-centered transfer function and a signal measurement output component of an output of the first magnetometer sensor, wherein the first magnetometer sensor operates with a lower power consumption than the second magnetometer sensor.

28. The assembly of claim 27, wherein the second magnetometer sensor has greater offset stability than the first magnetometer sensor.

29. The assembly of claim 27, wherein:
the first magnetometer sensor is a first package comprising at least one first sensing element and at least one first intelligence component;
the second magnetometer sensor is a second package comprising at least one second sensing element and at least one second intelligence component; and
the first package is operable independent of the second package.

30. The assembly of claim 27, wherein:
the first magnetometer sensor comprises at least one first sensing element;
the second magnetometer sensor comprises at least one second sensing element; and
the assembly further comprises a fully integrated monolithic single package comprising:
the first magnetometer sensor;
the second magnetometer sensor; and
at least one intelligence component that is operative to interpret outputs from the at least one first sensing element and outputs from the at least one second sensing element.

* * * * *